US006870749B1

(12) United States Patent
Park et al.

(10) Patent No.: US 6,870,749 B1
(45) Date of Patent: Mar. 22, 2005

(54) CONTENT ADDRESSABLE MEMORY (CAM) DEVICES WITH DUAL-FUNCTION CHECK BIT CELLS THAT SUPPORT COLUMN REDUNDANCY AND CHECK BIT CELLS WITH REDUCED SUSCEPTIBILITY TO SOFT ERRORS

(75) Inventors: Kee Park, San Jose, CA (US); Chuen-Der Lien, Los Altos Hills, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/619,635

(22) Filed: Jul. 15, 2003

(51) Int. Cl.[7] ............................................. G11C 7/00
(52) U.S. Cl. ........................................ 365/49; 365/200
(58) Field of Search .................................. 365/49, 200

(56) References Cited

U.S. PATENT DOCUMENTS

| | | | |
|---|---|---|---|
| 3,665,422 A | 5/1972 | McCoy et al. ............... | 365/222 |
| 4,112,502 A | 9/1978 | Scheuneman ............... | 364/900 |
| 4,747,080 A | 5/1988 | Yamada ....................... | 365/200 |
| 4,779,226 A | 10/1988 | Haraszti | |
| 4,791,606 A | 12/1988 | Threewitt et al. | |
| 4,903,268 A | 2/1990 | Hidaka et al. | |
| 4,958,352 A | 9/1990 | Noguchi et al. | |
| 4,991,136 A | 2/1991 | Mihara | |
| 5,046,046 A * | 9/1991 | Sweha et al. .......... | 365/185.04 |
| 5,127,014 A | 6/1992 | Raynham | |
| 5,184,325 A | 2/1993 | Lipovski .................... | 365/222 |
| 5,233,614 A | 8/1993 | Singh | |
| 5,319,589 A | 6/1994 | Yamagata et al. | |
| 5,450,424 A | 9/1995 | Okugaki et al. | |
| 5,455,834 A | 10/1995 | Chang et al. | |
| 5,469,450 A | 11/1995 | Cho et al. | |
| 5,491,703 A | 2/1996 | Barnaby et al. ........... | 371/40.1 |
| 5,561,429 A | 10/1996 | Halberstam et al. | |
| 5,570,377 A | 10/1996 | Merino Gonzalez et al. | |
| 5,572,460 A | 11/1996 | Lien | |
| 5,604,753 A | 2/1997 | Bauer et al. | |
| 5,629,950 A | 5/1997 | Godiwala et al. | |
| 5,642,320 A | 6/1997 | Jang .......................... | 365/222 |
| 5,644,583 A | 7/1997 | Garcia et al. | |
| 5,682,394 A | 10/1997 | Blake et al. | |
| 5,699,369 A | 12/1997 | Guha | |
| 5,724,296 A | 3/1998 | Jang | |
| 5,727,003 A | 3/1998 | Zook | |
| 5,761,222 A | 6/1998 | Baldi | |
| 5,796,671 A | 8/1998 | Wahlstrom | |
| 5,796,758 A | 8/1998 | Levitan ..................... | 371/49.1 |
| 5,872,802 A | 2/1999 | Knaack et al. ............ | 371/49.1 |
| 6,009,548 A | 12/1999 | Chen et al. | |

(List continued on next page.)

OTHER PUBLICATIONS

Halsall, Fred, "Data Communications, Computer Networks and OSI," Second Edition, 11 pages, no date.

Fourouzan, Behrouz, "Introduction to Telecommunications and Networking," Chapter 8, pp. 194–226, no date.

Kalter et al., "A 50–ns 16–Mb DRAM with a 10–ns Data Rule and On–Chip ECC," IEEE Journal of Solid–State Circuits, vol. 25, No. 5, Oct. 1990, pp. 1118–1127.

SiberCore Technologies, Soft Error in TCAMS: Causes and Cures, Jul. 2003, 5 pages.

*Primary Examiner*—Vu A. Le
(74) *Attorney, Agent, or Firm*—Myers Bigel Sibley & Sajovec

(57) ABSTRACT

Content addressable memory (CAM) devices include dual-function check bit cells that can operate as check bit cells to support error detection and correction (EDC) operations or as redundant CAM cells that support column redundancy. Dedicated check bit cells are also provided that have a reduced susceptibility to soft errors relative to adjacent CAM cells. The dedicated check bit cells may also be provided within a global mask cell sub-array to support correction of soft errors within global masks.

14 Claims, 16 Drawing Sheets

U.S. PATENT DOCUMENTS

| | | | |
|---|---|---|---|
| 6,032,214 A | 2/2000 | Farmwald et al. | |
| 6,058,500 A | 5/2000 | DesJardins et al. | |
| 6,067,656 A | 5/2000 | Rusu et al. | 714/768 |
| 6,134,631 A | 10/2000 | Jennings, III | |
| 6,151,247 A | 11/2000 | Estakhri et al. | |
| 6,154,384 A | 11/2000 | Nataraj et al. | 365/49 |
| 6,188,629 B1 | 2/2001 | Kaplinsky | |
| 6,199,140 B1 | 3/2001 | Srinivasan et al. | 711/108 |
| 6,216,246 B1 | 4/2001 | Shau | |
| 6,219,815 B1 | 4/2001 | DesJardins et al. | |
| 6,233,717 B1 | 5/2001 | Choi | |
| 6,243,281 B1 | 6/2001 | Pereira | 365/49 |
| 6,289,471 B1 | 9/2001 | Gordon | |
| 6,324,087 B1 | 11/2001 | Pereira | 365/49 |
| 6,362,990 B1 | 3/2002 | Gibson et al. | 365/49 |
| 6,374,325 B1 | 4/2002 | Simpson et al. | |
| 6,381,191 B2 | 4/2002 | Ooishi | |
| 6,397,290 B1 | 5/2002 | Williams et al. | |
| 6,408,417 B1 | 6/2002 | Moudgal et al. | |
| 6,421,265 B1 | 7/2002 | Lien et al. | 365/49 |
| 6,430,073 B1 | 8/2002 | Batson et al. | 365/49 |
| 6,434,033 B1 | 8/2002 | Chien | |
| 6,445,628 B1 * | 9/2002 | Pereira et al. | 365/200 |
| 6,477,615 B1 | 11/2002 | Tanaka | |
| 6,538,911 B1 | 3/2003 | Allan et al. | 365/49 |
| 6,542,391 B2 | 4/2003 | Pereira et al. | 365/49 |
| 6,560,156 B2 | 5/2003 | Lien et al. | 365/222 |
| 6,563,754 B1 | 5/2003 | Lien et al. | 365/222 |
| 6,597,595 B1 | 7/2003 | Ichiriu et al. | 365/49 |
| 6,618,281 B1 | 9/2003 | Gordon | 365/49 |
| 6,690,595 B1 | 2/2004 | Srinivasan et al. | 365/49 |
| 6,700,810 B1 | 3/2004 | Ichiriu et al. | 365/49 |
| 6,700,827 B2 | 3/2004 | Lien et al. | |
| 6,707,693 B1 | 3/2004 | Ichiriu | |
| 6,728,124 B1 | 4/2004 | Ichiriu et al. | |
| 6,741,253 B2 | 5/2004 | Radke et al. | |
| 6,775,168 B1 | 8/2004 | Park et al. | |
| 2002/0067632 A1 | 6/2002 | Batson et al. | |
| 2002/0075714 A1 | 6/2002 | Pereira et al. | 365/49 |
| 2002/0159320 A1 | 10/2002 | Lien et al. | |
| 2003/0007408 A1 | 1/2003 | Lien et al. | 365/222 |
| 2003/0074630 A1 | 4/2003 | Batson et al. | 714/805 |
| 2003/0081464 A1 | 5/2003 | Vlasenko | 365/200 |

* cited by examiner

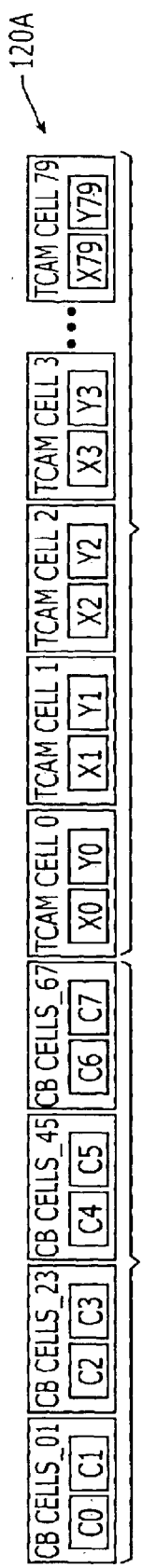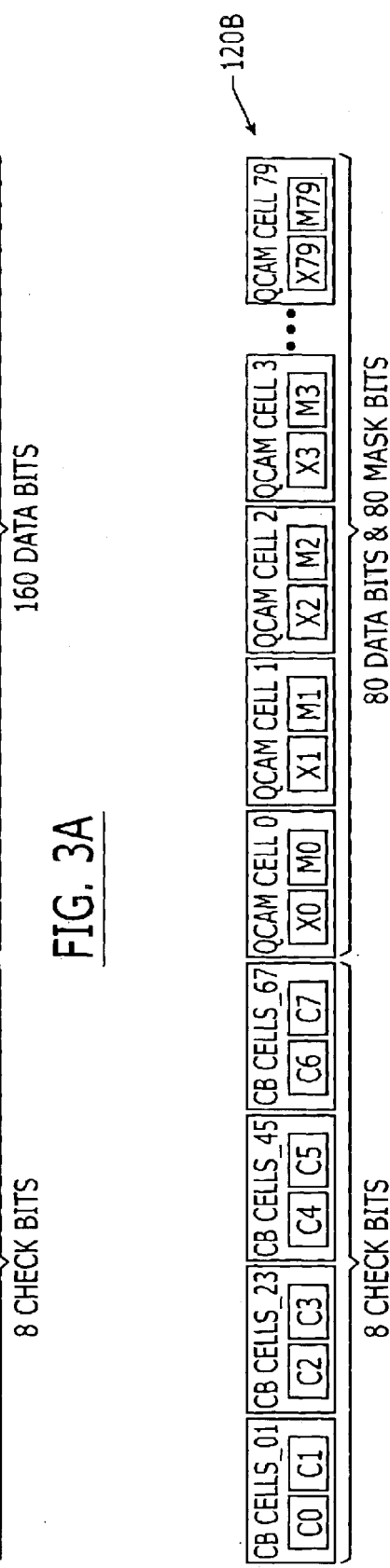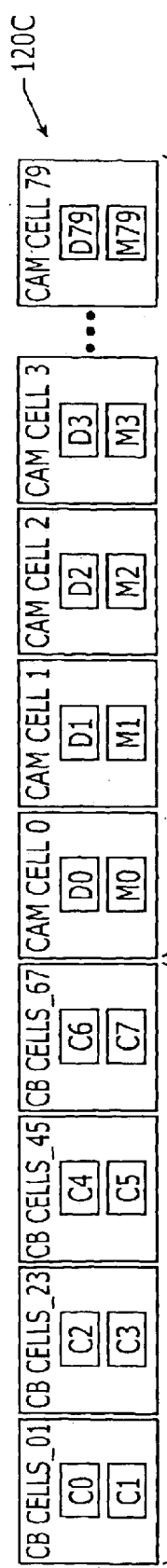
FIG. 3A
FIG. 3B
FIG. 3C

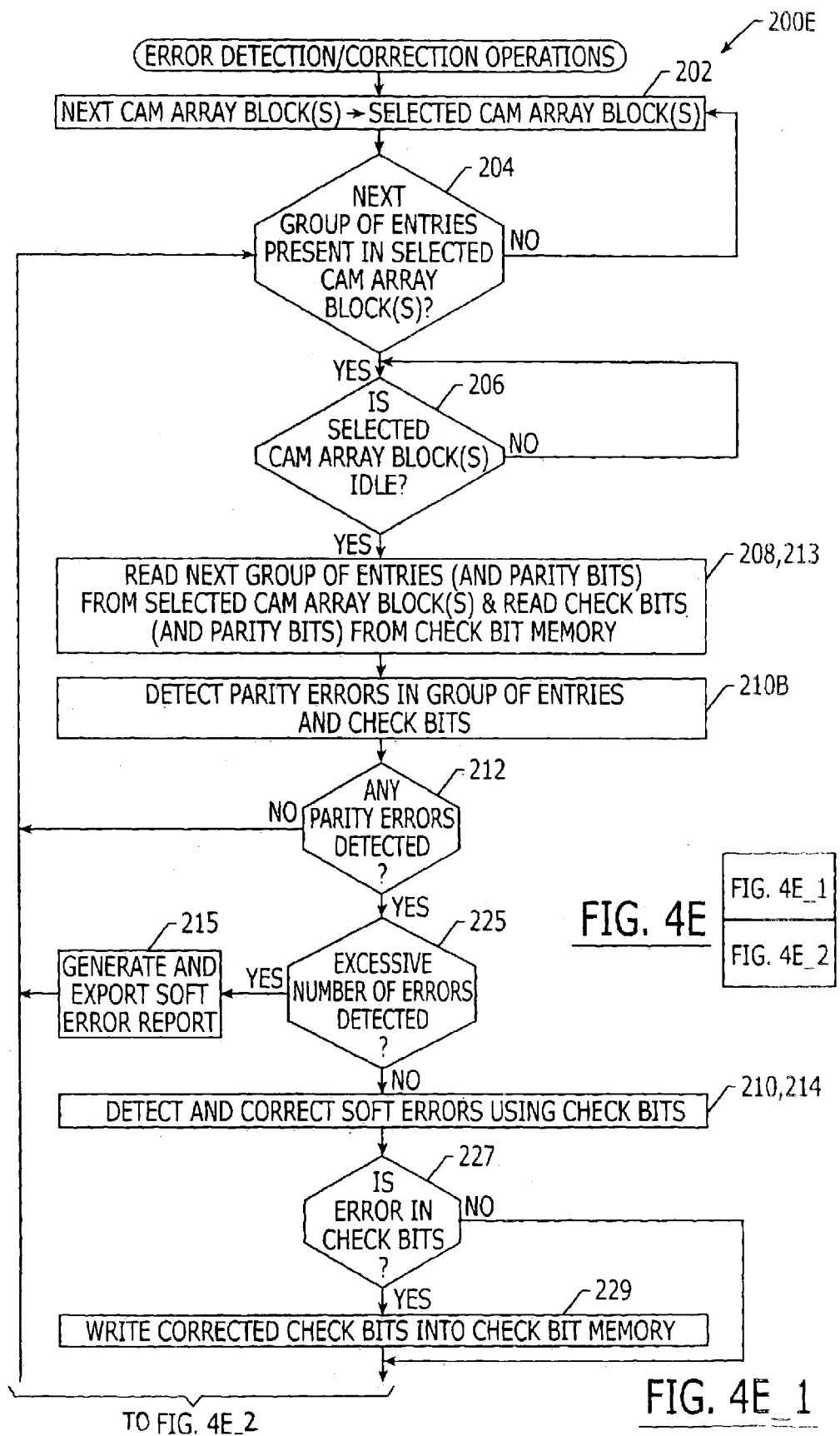

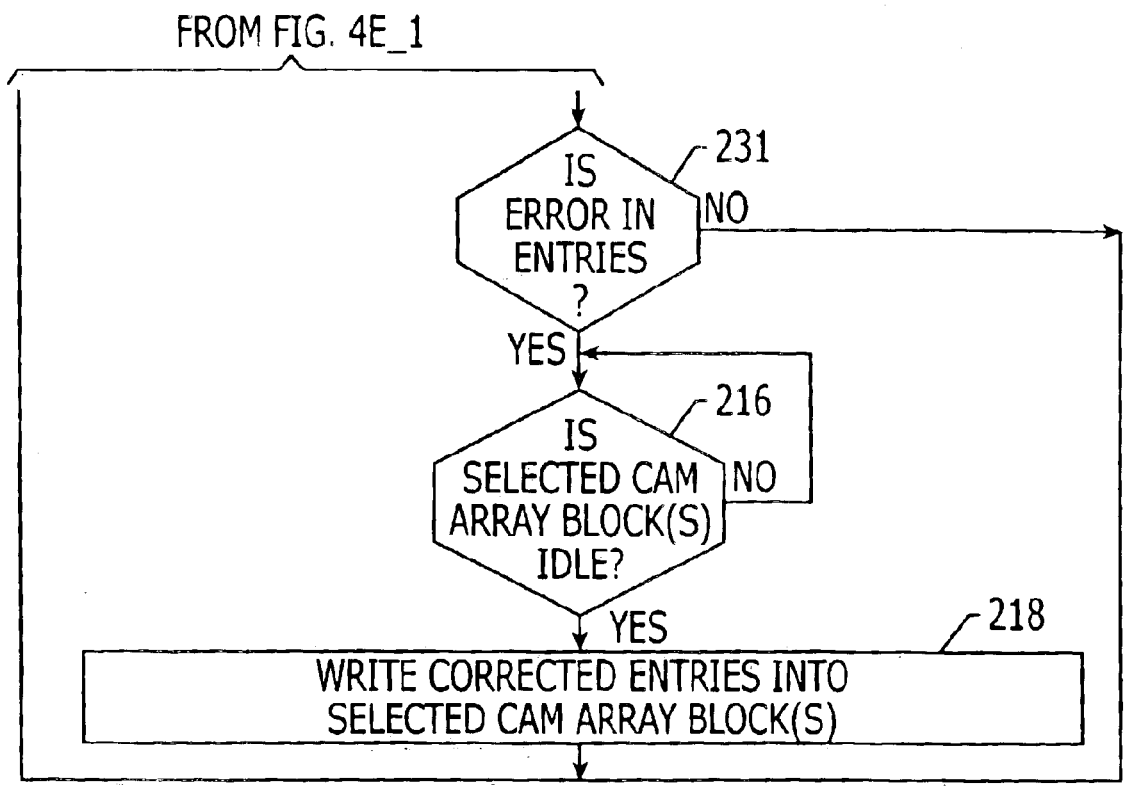
FIG. 4E_2

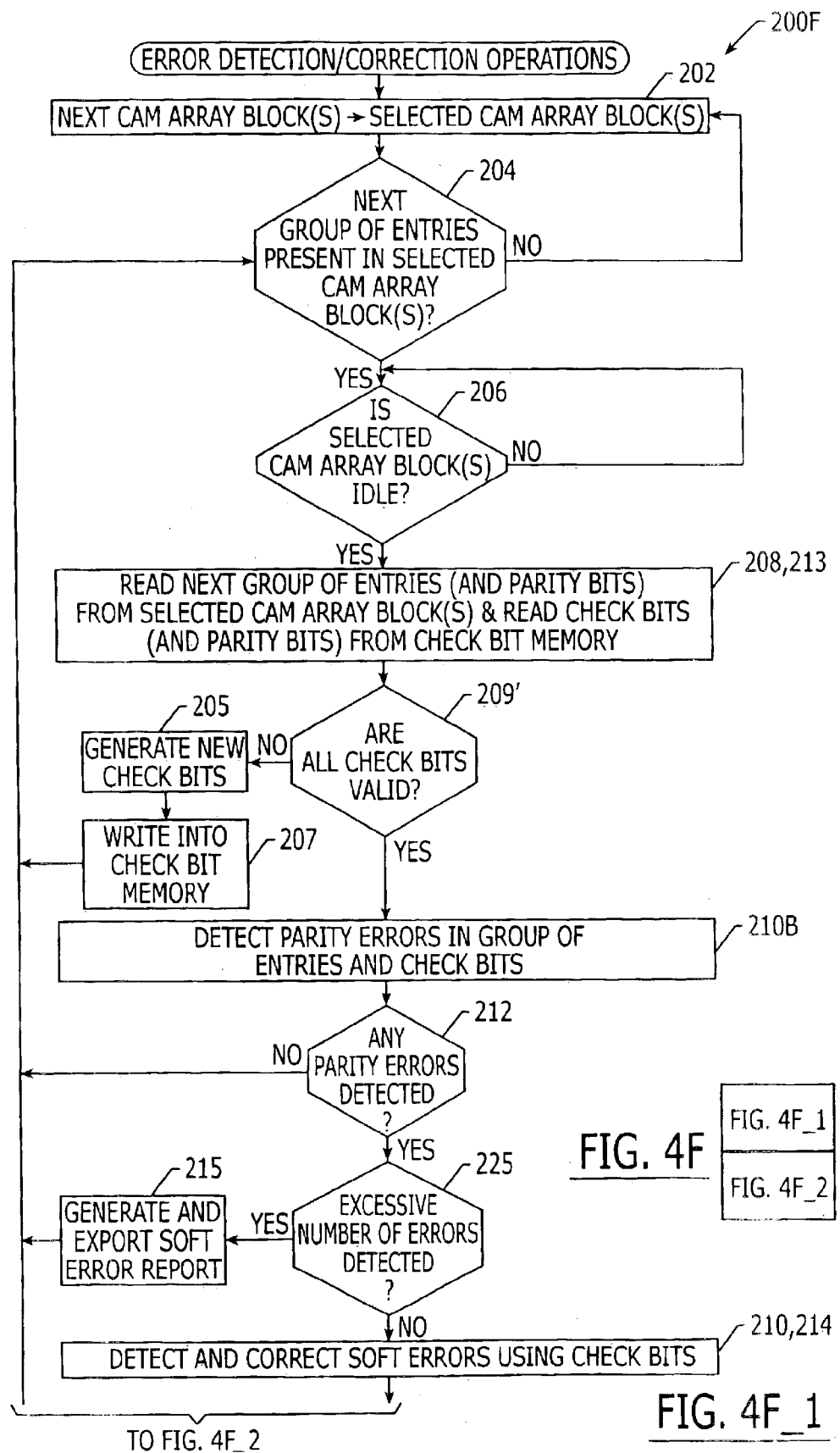

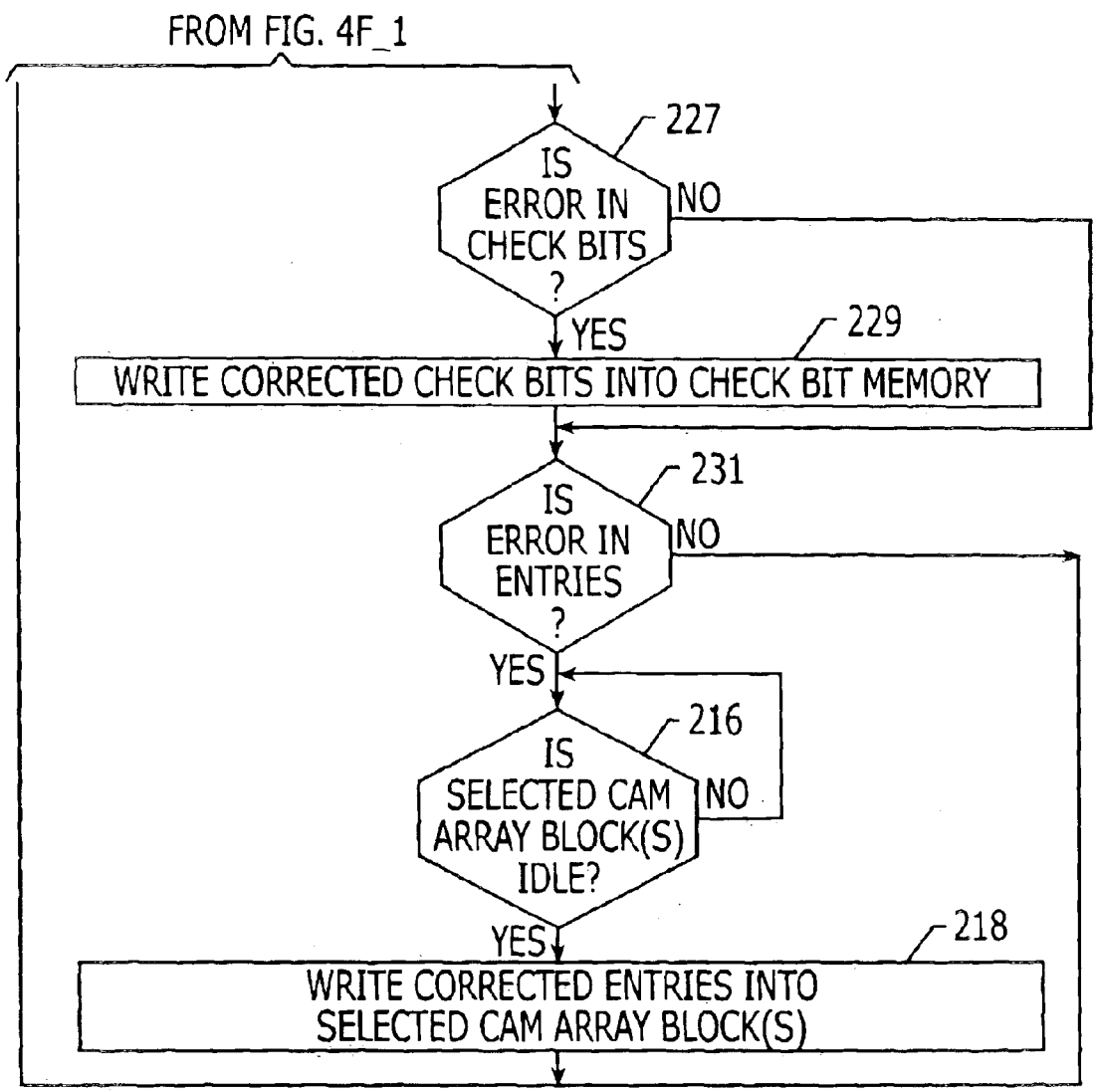
FIG. 4F_2

CONTENT ADDRESSABLE MEMORY (CAM) DEVICES WITH DUAL-FUNCTION CHECK BIT CELLS THAT SUPPORT COLUMN REDUNDANCY AND CHECK BIT CELLS WITH REDUCED SUSCEPTIBILITY TO SOFT ERRORS

REFERENCE TO RELATED APPLICATION

This application is related to U.S. application Ser. No. 10/619,638, filed Jul. 15, 2003, entitled "Content Addressable Memory (CAM) Devices Having Error Detection and Correction Control Circuits Therein and Methods of Operating Same", the disclosure of which is hereby incorporated herein by reference.

FIELD OF THE INVENTION

The present invention relates to integrated circuit memory devices and, more particularly, to content addressable memory (CAM) devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g., search words) to the array and then performing a search operation to identify one or more entries within the CAM array that contain data equivalent to the applied data and thereby represent a "match" condition. In this manner, data is accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. Additional CAM devices are described in U.S. Pat. Nos. 5,706,224, 5,852,569 and 5,964,857 to Srinivasan et al. and in U.S. Pat. Nos. 6,101,116, 6,256,216,6,128,207 and 6,262,907 to Lien et al., assigned to the present assignee, the disclosures of which are hereby incorporated herein by reference.

CAM cells are frequently configured as binary CAM cells that store only data bits (as "1" or "0" logic values) or as ternary (or quaternary) CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, . . . , {1XXX}, {XXXX}. As will be understood by those skilled in the art, conventional "quatemary" CAM cells, which have four valid combinations of states: ((data=0, mask=active), (data=1, mask=active), (data=0, mask=inactive), (data=1, mask=inactive)), are frequently treated as "ternary" CAM cells because two of the four states represent an equivalent active mask condition. In contrast, ternary CAM cells may include CAM cells having two bits of data that are configurable in only three valid combinations: ((0,1)=0, (1,0)=1, (0,0)=mask and (1,1)=invalid). Both types of cells will be referred to herein as ternary CAM cells.

CAM devices may also use coding techniques to detect and correct one-bit soft errors in entries within a CAM array. One such CAM device that uses a parity comparator to detect errors is described in U.S. Pat. No. 6,067,656 to Rusu et al., entitled "Method and Apparatus for Detecting Soft Errors in Content Addressable Memory Arrays." Another such CAM device that uses dynamic content addressable memory (DCAM) cells is disclosed in U.S. Pat. No. 6,430,073 to Batson et al., entitled "DRAM CAM Cell with Hidden Refresh." In particular, the '073 patent discloses a technique for performing hidden refresh of dynamic CAM entries using non-destructive read operations that may be performed during match line (ML) precharge operations. Upon reading, the entries may be checked for errors and possibly corrected before undergoing a refresh write operation.

In some applications, multiple CAM devices may be used in a system that groups CAM entries according to their numeric value. For example, as illustrated by FIG. 1A, multiple ternary CAM devices, shown as TCAM CHIP0–CHIP7, may be used in a system 10 that processes internet protocol addresses (IP_ADDRESS) as comparands that are applied to the CAM devices during search operations. In the system 10 of FIG. 1A, a programmable address comparator 12 responds to a received address by generating a multi-bit instruction valid signal (INSTRUCTION_VALID). This instruction valid signal may operate to selectively enable one of the multiple CAM devices during a search operation that is performed in response to a search instruction (INSTRUCTION). During the search operation, the other CAM devices may remain idle or undergo local operations. As illustrated by FIG. 1B, the entries within the multiple CAM devices of FIG. 1A may be sorted into groups having address boundaries that accord with a partitioned Patricia Tree of addresses: with CHIP0 containing 32-bit addresses that range between address A0 (shown as 0.0.0.0) and address A1 and CHIP7 containing 32-bit addresses that range between address A7 and address A8 (shown as 255.255.255.255). Moreover, the programmable address comparator 12 may be programmed with the boundary addresses A0–A8. Thus, upon receipt of an IP_ADDRESS having a value that falls within the range between address An and address A(n+1), TCAM CHIPn will be selected to undergo a search operation while the other CAM devices remain idle. Similarly, U.S. Pat. Nos. 6,324,087, 6,538,911 and 6,542,391 appear to disclose CAM devices having multiple CAM array blocks therein that may be selectively idled to conserve power during partial chip search operations.

Notwithstanding these CAM devices, there continues to be a need for improved CAM devices having enhanced performance and reliability characteristics.

SUMMARY OF THE INVENTION

Embodiments of the present invention include a content addressable memory (CAM) device having an error detection and correction (EDC) control circuit therein. The EDC control circuit operates to correct soft errors in entries within a plurality of internal CAM array blocks with, at most, limited interruption to other operations performed by the CAM device. The EDC control circuit utilizes a multi-bit check word associated with each entry to detect a soft error and perform one-bit error correction on the entry. The EDC control circuit may be configured to be active during a background mode of operation when the CAM array blocks are undergoing search operations in a foreground mode of operation. According to a preferred aspect of these embodiments, a group of entries (and possibly check words) are read from a selected CAM array block(s) when the respective block(s) is idle. This CAM array block may be idle when the entire CAM device is idle during a standby mode of operation (e.g., no-op mode of operation) or when another CAM array block is undergoing a local operation, such as a write, read or search operation. The group read operation may be performed as a burst read operation that quickly accesses a plurality of consecutive rows within a selected CAM array block. This type of group read operation may result in a "vertical" group of entries that undergo error detection and correction. Alternatively, the group read operation may access a selected row(s) within a plurality of CAM array blocks. For example, a group read operation may include accessing a selected row within each of a plurality of CAM array blocks. This type of group read operation may result in a "horizontal" group of entries that undergo error detection and correction. Other types of group read operations may also be performed. The EDC control circuit also includes counters and arbitration and control logic that systematically evaluates the entries in each CAM array block for soft errors. In some cases, the CAM array blocks are evaluated for soft errors in a predetermined sequence that is repeated once every entry in every CAM array block in the device has been checked.

During the group read operation, the group of entries may be stored within an internal EDC entry buffer and then evaluated for the presence of soft errors. The soft errors, if any, are then corrected. These detection and correction operations are preferably performed while the CAM device is undergoing other foreground operations (e.g., search operations). The EDC control circuit may also be configured to write a corrected entry back into its original location within a respective CAM array block when the block is once again idle. This write operation may be performed while other blocks are undergoing search, write and/or read operations. Alternatively, the corrected entry may be written into another location within the CAM device and the original entry, now determined to be erroneous, may be indicated as being invalid. An entry may be identified as invalid by deasserting a valid bit associated with the original entry. This valid bit may be held by a respective memory cell within each row of CAM cells.

In further embodiments of the invention, each entry within a CAM array block may include a composite string of data and mask bits and the multi-bit check word associated with each entry may be of sufficient length to enable the detection and correction of at least a one-bit soft error within the composite string of data and mask bits. For example, the length "c" of the multi-bit check word may be sufficient to meet the following relationship: $2^c \geq N_d + N_m + c + 1 \geq 2^{c-1}$, where $N_d$ equals the number of data bits in the entry and $N_m$ equals the number of mask bits in the entry. Thus, if a CAM array block has a logical width of 80 active CAM cells (e.g., lateral quaternary CAM cells) that each store two bits of information, then the length "c" of the multi-bit check word can be eight (8) bits (i.e., $2^8 \geq 80+80+8+1 \geq 2^7$). For those ternary CAM cells which do not, strictly speaking, include a mask bit, the above relationship may be expressed as: $2^c \geq 2N + c + 1 \geq 2^{c-1}$, where N is a logical width of the CAM array block. In still further embodiments of the invention, one or more check bits may operate as parity bits that facilitate error detection and error reporting, but do not provide internal error correction capability. For example, if ternary CAM cells are provided as lateral XY CAM cells, then one X-type parity bit may be provided for the X data within an entry and one Y-type parity bit may be provided for the Y data within an entry.

Still further embodiments of the present invention include CAM array blocks having dual-function cells therein that advantageously support column redundancy. In these CAM array blocks, a plurality of rows are provided and each row comprises a plurality of CAM cells and at least one dual-function check bit cell(s) that is configurable as a CAM cell when necessary to account for a defective CAM cell in the at least one row. Additional dedicated check bit cells, which are not configurable as CAM cells, may also be provided within each row. These dedicated check bit cells may be configured to be less susceptible to soft errors relative to the plurality of CAM cells (and even the dual-function check bit cell(s)). In particular, the storage nodes within the dedicated check bit cells may provide a greater degree of storage capacitance that facilitates a higher degree of data retention in the presence of environmental factors that promote soft errors (e.g., alpha particle disturbances). To support column redundancy in the presence of a defective CAM cell, the dual-function check bit cell(s) may be configured as a CAM cell and another dedicated check bit cell(s) may be enabled to replace the dual-function check bit cell(s).

In still further embodiments of the present invention, the CAM array blocks may be provided with dedicated mask cell sub-arrays therein. These mask cell sub-arrays provide global masks that are active during search operations (notwithstanding the presence of local masks within each ternary CAM entry). In particular, each CAM array block may include a plurality of consecutive rows of dedicated global mask cells therein. These rows may also be provided with check bit cells so that soft errors within each global mask may be detected and corrected. For example, each of the plurality of rows of dedicated global mask cells may include a respective plurality of check bit memory cells that are configured to store a check word of sufficient length to enable the correction of at least one soft error in at least one global mask stored in the corresponding row of dedicated global mask cells. These check bit memory cells may also be configured to be less susceptible to soft errors relative to the global mask cells. Moreover, in some applications, the global mask cells may be configured to be less susceptible to soft errors relative to the ternary CAM cells with a corresponding CAM array block.

BRIEF DESCRIPTION OF THE DRAWINGS

FIG. 3A is a block diagram that illustrates an arrangement of cells within a row of a ternary CAM array block, according to embodiments of the present invention.

FIG. 3B is a block diagram that illustrates an arrangement of cells within a row of a quaternary CAM array block, according to embodiments of the present invention.

FIG. 3C is a block diagram that illustrates another arrangement of cells within a row of a quaternary CAM array block, according to embodiments of the present invention.

FIG. 4E is a flow diagram of operations that illustrates methods of performing error detection and correction operations in CAM devices, according to embodiments of the present invention.

FIG. 4F is a flow diagram of operations that illustrates methods of performing error detection and correction operations in CAM devices, according to embodiments of the present invention.

DESCRIPTION OF PREFERRED EMBODIMENTS

Figure 1A:
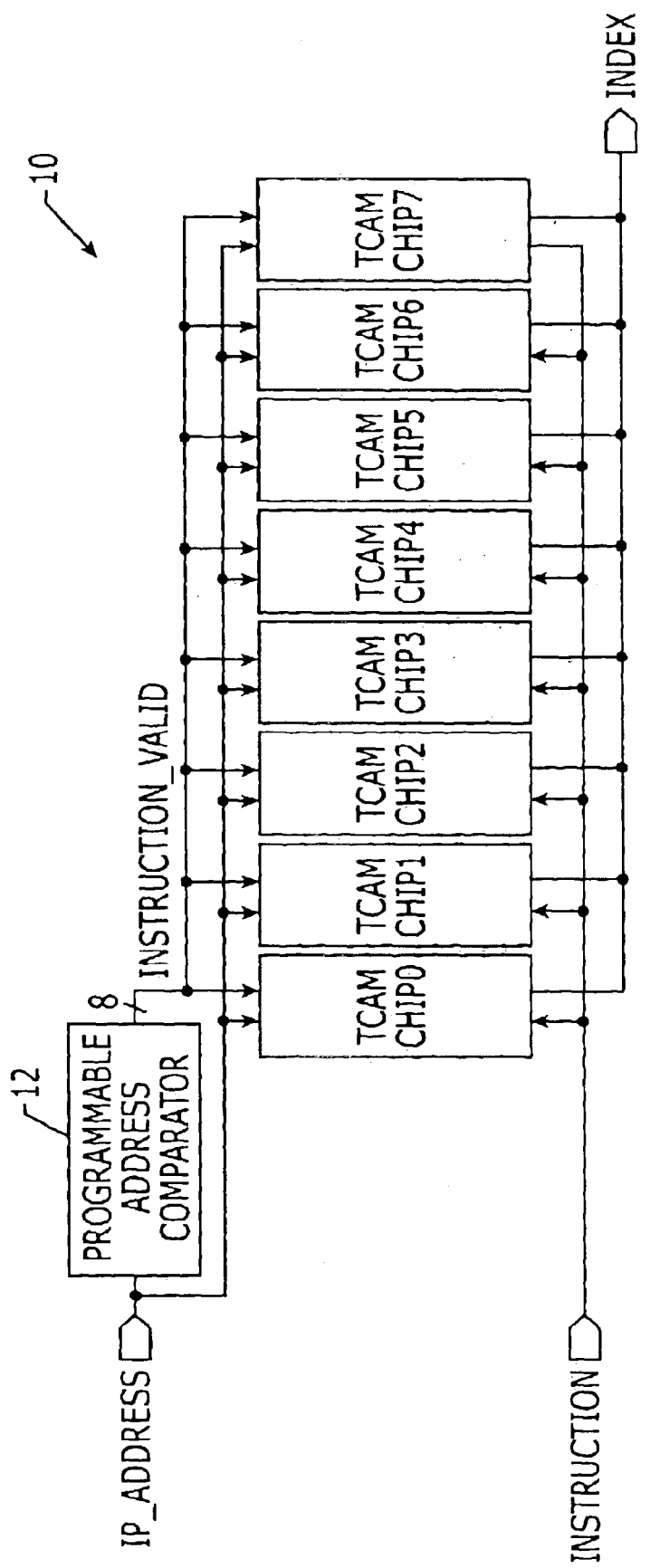
FIG. 1A is a block diagram that illustrates a conventional CAM system, which uses multiple CAM chips to process internet protocol addresses.
Figure 1B:
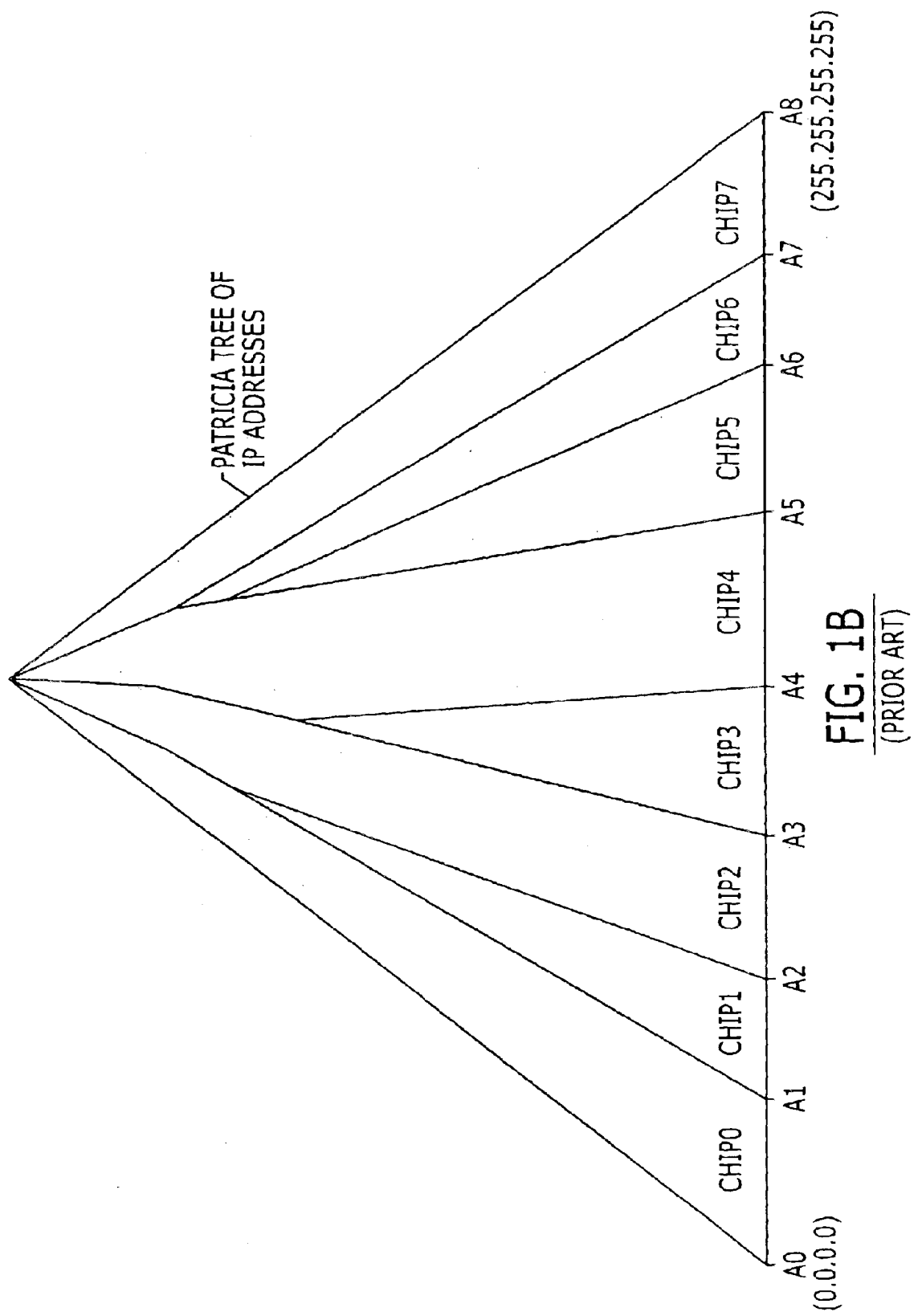
FIG. 1B is a diagram that illustrates a conventional partitioning of addresses within a Patricia Tree.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 2A:
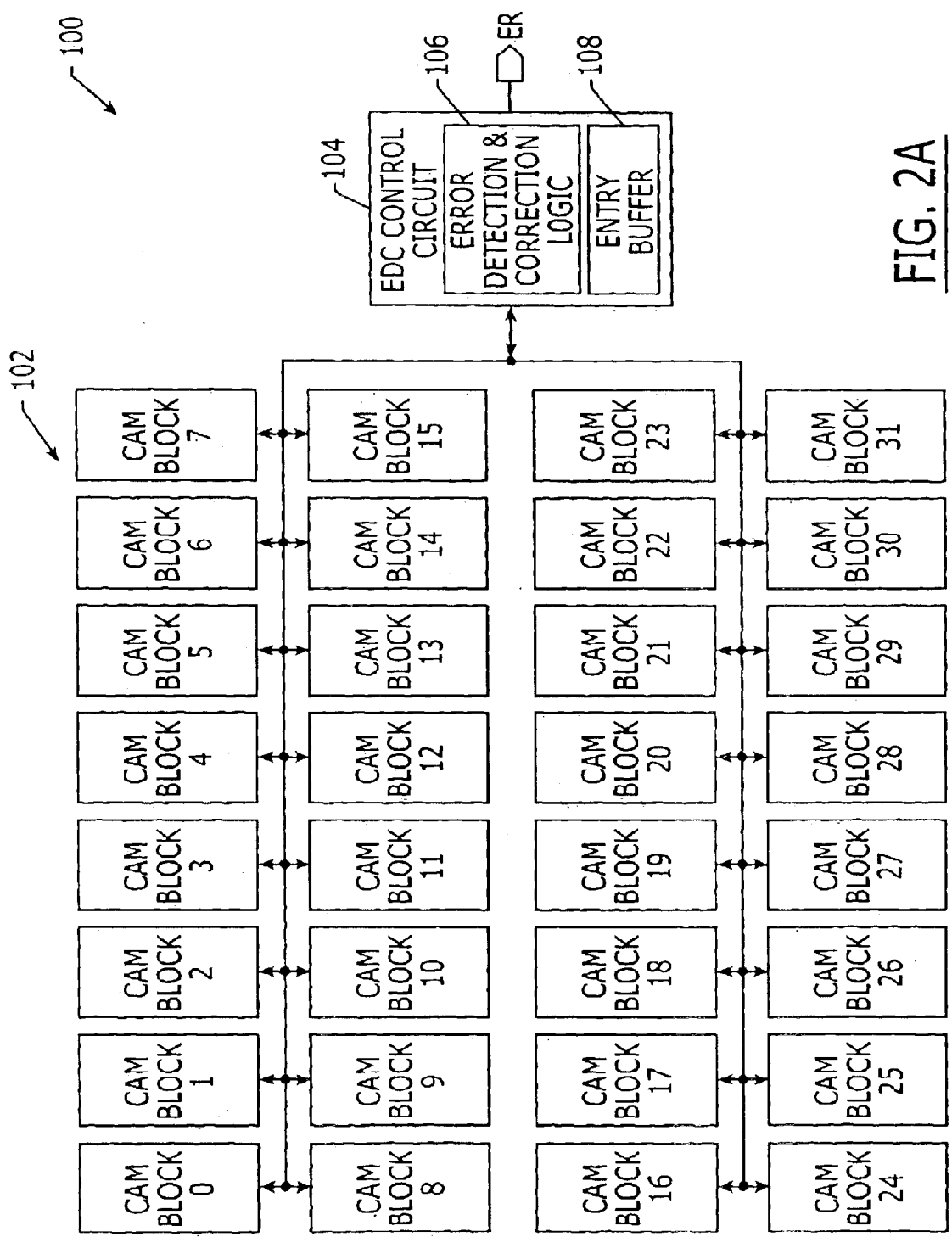
FIG. 2A is a block diagram of a content address memory (CAM) device with an error detection and correction (EDC) control circuit therein, according to an embodiment of the present invention.

Referring now to FIG. 2A, a CAM device 100 according to an embodiment of the present invention includes a plurality of CAM array blocks 102 that are integrated on an integrated circuit substrate (e.g., semiconductor chip). For purposes of discussion herein, each of the plurality of CAM array blocks 102, shown as 32 blocks, may have a logical width that supports 80 bit comparands during search operations and a depth of 1024 searchable rows, for example. Other arrangements and sizes of CAM array blocks are also possible on an integrated circuit substrate. For example, a 20-Meg CAM device may be provided using 64 blocks having 4096×80 entries therein. Multiple entries within a CAM array block may be grouped together to support longer comparands. Alternatively, multiple blocks may also be coupled together to support longer comparands and conventional techniques may be used to support the use of shorter comparands (e.g., 40 bit comparands) during search operations. The performance of search operations within CAM array blocks are more fully described in U.S. application Ser. No. 10/263,223, filed Oct. 2, 2002, U.S. application Ser. No. 10/263,258, filed Oct. 2, 2002 and in U.S. application Ser. No. 10/323,236, filed Dec. 18, 2002, assigned to the present assignee, the disclosures of which are hereby incorporated herein by reference.

As illustrated, the CAM array blocks 102 are electrically coupled to an error detection and correction (EDC) control circuit 104. This EDC control circuit 104 includes error detection and correction logic 106 and may include an entry buffer 108, however, in many embodiments an entry buffer 108 may not be necessary. The EDC control circuit 104 operates with other conventional control logic (not shown) to perform the operations illustrated by FIGS. 4A–4D. The EDC control circuit 104 may also be configured to generate error report (ER) signals that are output from the CAM device 100. In some applications, these error report signals may be used by a system controller (not shown) to facilitate correction of entries within the CAM device 100. Although the EDC control circuit is illustrated as a single circuit that supports all the CAM array blocks, multiple "local" EDC control circuits may also be used. For example, each CAM array block or group of blocks may be associated with a respective EDC control circuit.

The entry buffer 108, which may be configured as an array of storage elements, may have sufficient capacity to retain an entire group of entries that are read from a CAM array block during an error detection and correction cycle. As described herein, the entry buffer 108 is treated as having sufficient capacity to store a group of 64 entries from one or more CAM array blocks. Accordingly, if the depth of a CAM array block is 1024 searchable rows, then 16 "vertical" group read operations, which access 64 consecutive entries per read operation, can be performed to fully check a respective CAM array block for soft errors, as explained more fully hereinbelow. Alternatively, a "horizontal" group read operation(s) may be performed to access corresponding entries within a plurality of CAM array blocks. For example, a horizontal group read operation(s) may be performed to access a selected row within an integer number of CAM array blocks. In the illustrated embodiment of FIG. 2A, the integer number may equal eight (8). However, in alternative embodiments, the integer number may have a different value (e.g., N=16, 32, 64, . . . ).

In the event each of the CAM array blocks retain a dedicated global mask cell sub-array in addition to a CAM cell sub-array, then an additional read operation(s) may be required to enable detection and correction of errors with the mask cell sub-array. The operation of CAM array blocks having mask cell sub-arrays therein is more fully described in U.S. application Ser. No. 10/386,400, filed Mar. 11, 2003, the disclosure of which is hereby incorporated herein by reference.

Figure 2B:
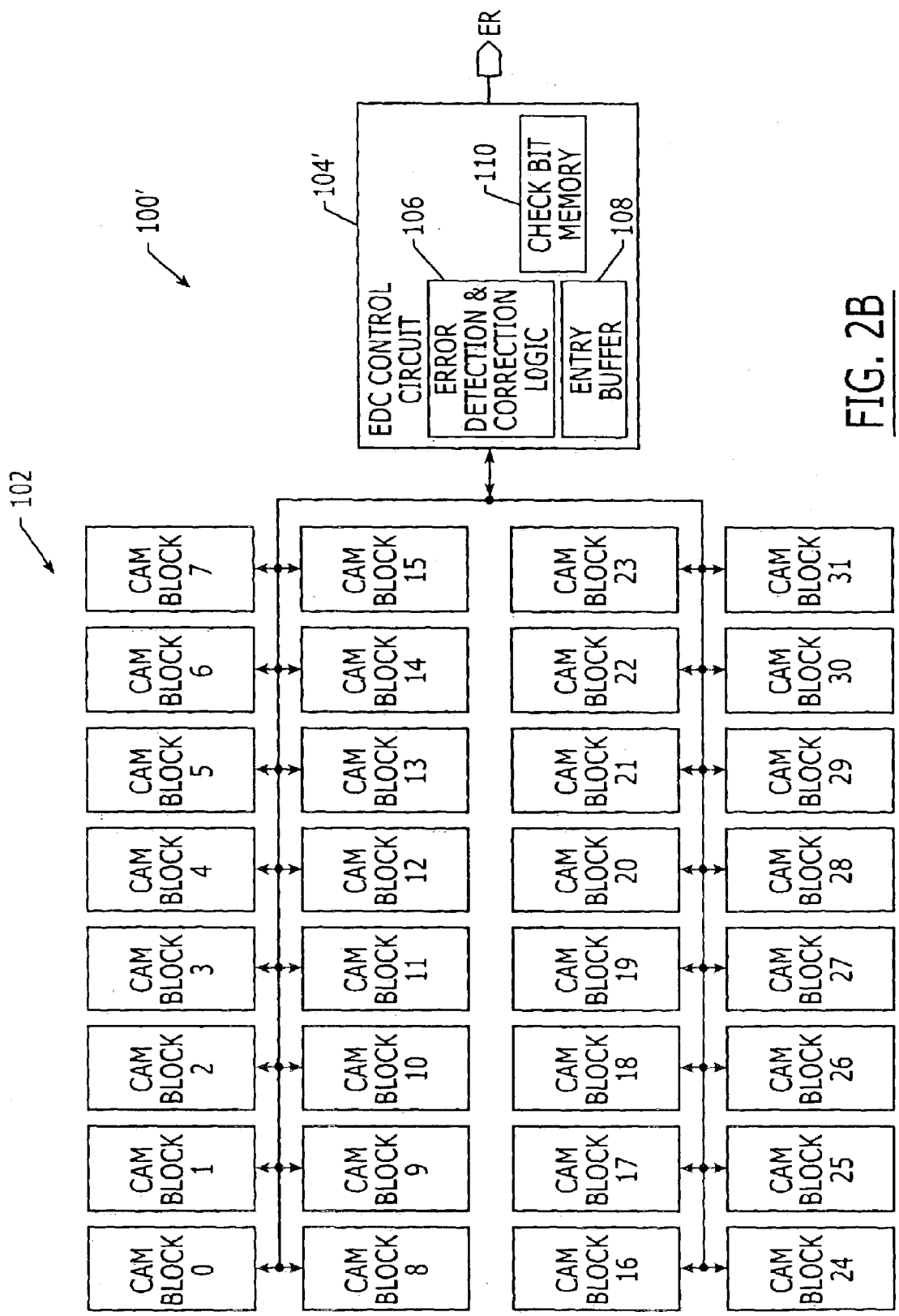
FIG. 2B is a block diagram of a content address memory (CAM) device with an error detection and correction (EDC) control circuit therein, according to another embodiment of the present invention.

Referring now to FIG. 2B, a CAM device 100' according to another embodiment of the present invention includes an EDC control circuit 104' having a check bit memory array 110 therein. This check bit memory array 110 may be of sufficient size to retain check bit words associated with each entry in each of the illustrated CAM array blocks 102. In some embodiments of the invention, this check bit memory array 110 comprises constitutes a random access memory (RAM) array. By using a dedicated check bit memory array 110, it may not be necessary for the rows within the CAM array blocks to retain respective check bit words. Nonetheless, the rows within the CAM array blocks may retain one or more parity bit cells so that local error checking operations may be performed in an efficient manner in each block. The EDC control circuit 104' may also include mapping logic (not shown) that is configured to associate each of the check bit words in the check bit memory array 110 with its corresponding entry within a CAM array block. Additional control logic (not shown) should be provided for resetting the entries within the CAM array blocks (including check bit data and/or parity data) after power-up. This will insure that the performance of error detection and correction operations on unused entries will not result in the erroneous detection of errors. In particular, the operations to reset the values of the entries within the CAM array blocks will also include operations to set the parity and check bits at values that reflect the correct parity and correct check bit values for the reset entries. However, as described more fully hereinbelow, the use of a flag cell associated with each entry (or group of entries) may enable a simpler reset operation whereby only the flag cells need to be reset upon power up. In some embodiments, the flag cells may be separate from the CAM array blocks to enable more frequent access to flag bit data when the CAM array blocks are busy.

Figure 4A:
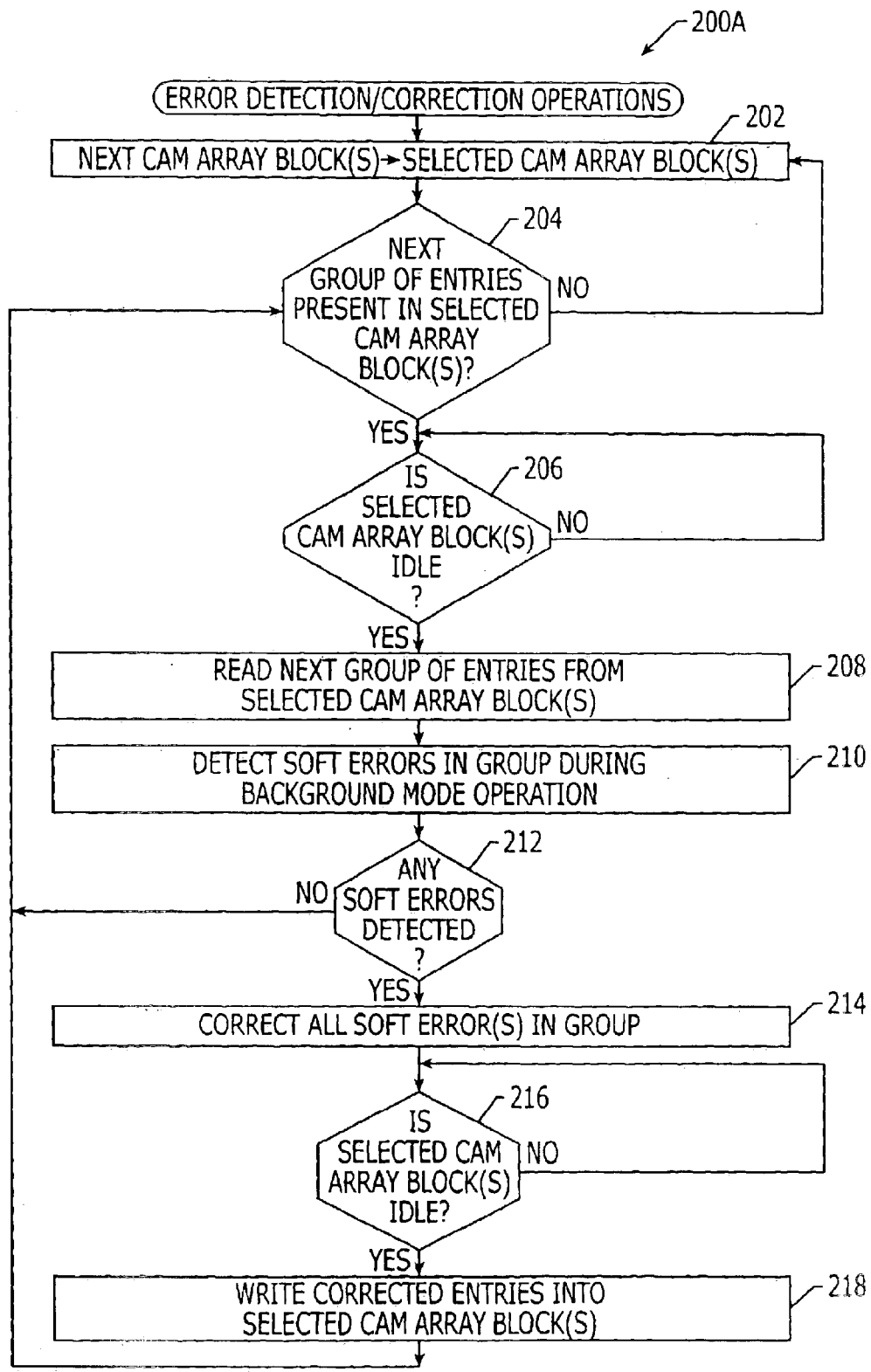
FIG. 4A is a flow diagram of operations that illustrates methods of performing error detection and correction operations in CAM devices, according to embodiments of the present invention.

Operations performed by the EDC control circuits 104 and 104' of FIGS. 2A–2B will now be more fully described with reference to the flow diagram of operations illustrated by FIGS. 4A–4D. In FIG. 4A, the error detection/correction operations 200A include identifying a CAM array block(s) to be evaluated, Block 202. The evaluation of the CAM array blocks may follow a predetermined sequence that is repeated continuously as a series of mostly background operations. For purposes of explanation herein, the predetermined sequence follows the numeric ordering of the CAM array blocks, with CAM Block 0 being the first block to be evaluated for soft errors and CAM Block 31 being the last block to be evaluated before the sequence is repeated. Alternatively, the sequence may access CAM Blocks 0–7 as a first group, followed by the CAM Blocks 8–15, 16–23 and 24–31 as the second, third and fourth groups. In still further embodiments of the present invention, the operations of Block 202 may be omitted.

As illustrated by Block 204, a check is made to determine whether a next group of entries to be evaluated is present within the selected CAM array block(s), Block 204. This check may be made with the assistance of a pointer/counter that sequentially counts through each "vertical" group of entries within a selected CAM array block or each "horizontal" group of entries within a selected plurality of CAM array blocks (e.g., Blocks 0–7, 8–15, 16–23 or 24–31). If a next group of entries to be evaluated is not present, then the next CAM array block(s) in the sequence is treated as the selected (i.e., current) CAM array block(s), Block 202. In some embodiments of the present invention, the selected CAM array block(s) is not evaluated for soft errors until it becomes idle, Block 206. As will be understood by those skilled in the art, a CAM array block(s) may become idle when the entire CAM device is idle in a standby mode of operation or when another CAM array block(s) within the device is undergoing a local operation, such as an entry read or an entry write operation or a search operation, for example. Upon detection of the selected CAM array block(s) as idle, the next group of entries are read from the selected CAM array block(s), Block 208. This read operation may be performed as a "vertical" read operation that quickly reads from a group of consecutive entries within the selected CAM array block. Alternatively, the read operation may be performed as a "horizontal" read operation that accesses corresponding rows within a plurality of adjacent CAM array blocks. In one embodiment, the "vertical" read operation may fill the entry buffer 108 with N consecutive entries from the selected CAM array block (e.g., N=64). In another embodiment, a "horizontal" read operation may fill the entry buffer 108 with corresponding entries from N CAM array blocks.

As illustrated by Block 210, a background operation may then be performed to determine whether any errors are present within the group of entries stored within the entry buffer 108. Here, the check bits associated with each entry are used to determine the presence of a one-bit error (or possibly more errors) using error detection operations. These error detection operations may include generating a syndrome word(s) that provides an "address" of a bit in error. If no errors are detected, Block 212, then the next group of entries within the selected CAM array block(s) is pursued, Block 204. This next group of entries may represent a "vertical" group of entries within a selected CAM array block or a "horizontal" group of entries from a selected plurality of CAM array blocks (e.g, one selected row from each of a plurality of adjacent CAM array blocks). However, if one or more errors are detected within the group of entries, then correction operations are performed to correct the erroneous entry or entries, Block 214. As explained more fully hereinbelow with respect to FIG. 4C, if the check bit(s) associated with each entry represents a parity bit(s), then error correction operations may not be available.

Following the correction operation, Block 214, on operation is performed to determine whether the selected CAM array block(s) is idle, Block 216. Upon detection that the selected CAM array block(s) is idle, the corrected entry (or entries) from the group is then written back into the selected CAM array block(s), Block 218. This write operation may be performed when other CAM array blocks are being searched, read from or written to. Returning to Blocks 204 and 202, the next group in the selected CAM array block(s) (or the first group in the next CAM array block(s) within the sequence) is then identified and a group read operation is then performed.

In this manner, the error detection and correction operations are performed continuously during mostly background modes of operation, while foreground search operations (or other read/write operations) are being performed within the CAM device. These background operations preserve the integrity of the entries within the CAM device, without substantially impacting its search frequency or speed. However, because the frequency at which the entries are evaluated for errors is a function of the frequency at which the CAM array blocks in the sequence become idle, additional queuing and arbitration circuitry (not shown) may be active within the EDC control circuits 104 and 104' to support sufficiently frequent evaluation of the entries within the CAM array blocks when sufficient idles cycles are not otherwise present. If necessary to preserve data integrity, this additional queuing and arbitration circuitry may generate interrupt commands that force one of more idle cycles within the CAM device. Moreover, the above-described error correction operations may be preceded by error detection operations that are performed locally within each CAM array block (using parity bits associated with each entry). In this manner, one or more of the "global" error detection/correction operations may be omitted if no "local" errors are initially detected when the group of entries are being read from a selected CAM array block(s).

Figure 4B:
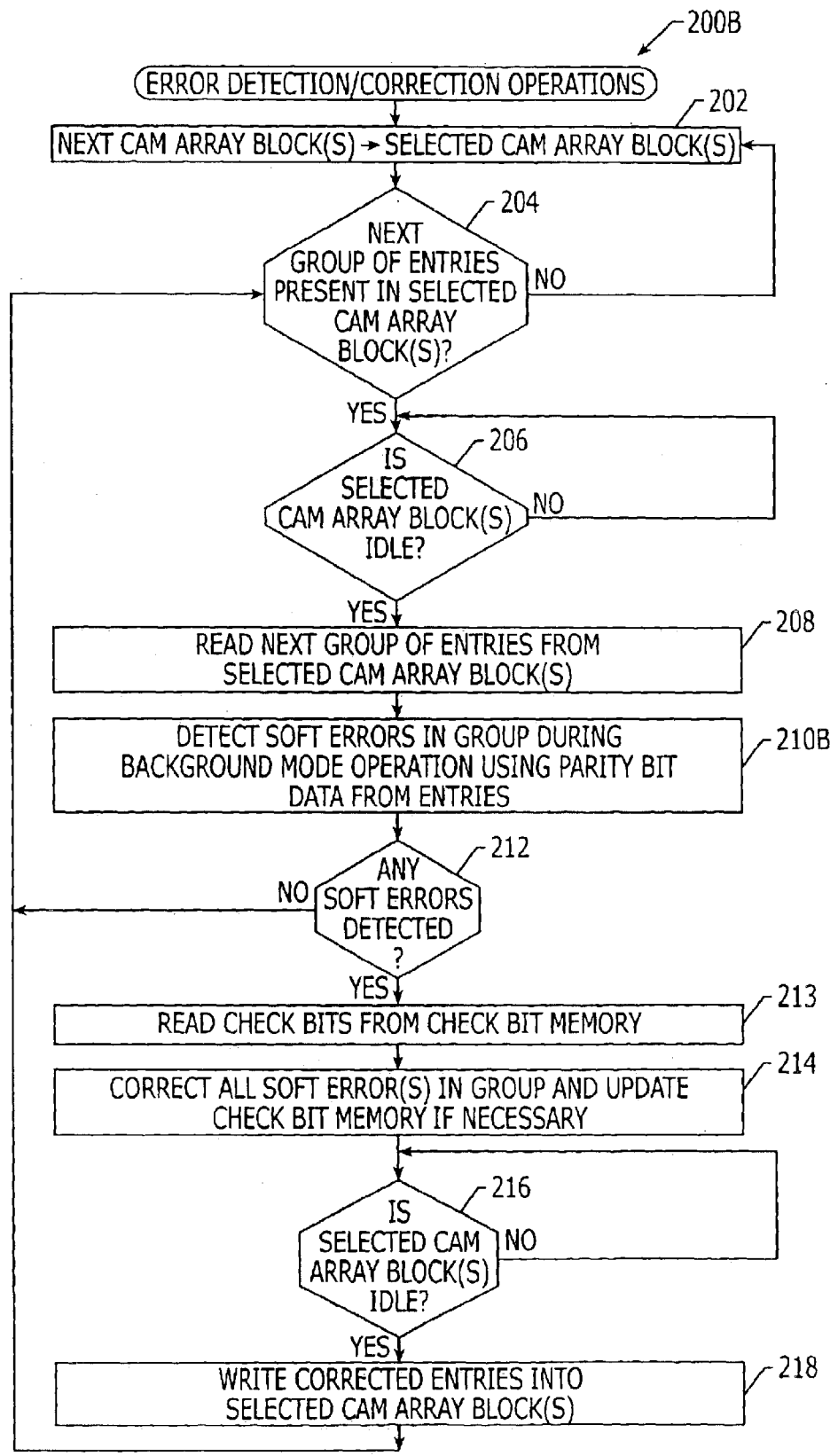
FIG. 4B is a flow diagram of operations that illustrates methods of performing error detection and correction operations in CAM devices, according to embodiments of the present invention.

The error detection/correction operations 200B illustrated by FIG. 4B are similar to the ones illustrated by FIG. 4A, but require the reading of check bit data from the dedicated check bit memory 110 illustrated by FIG. 2B. The error detection/correction operations 200B include identifying a CAM array block(s) to be evaluated, Block 202. As illustrated by Block 204, a check is made to determine whether a next group of entries to be evaluated is present within the selected CAM array block(s), Block 204. If a next group of entries to be evaluated is not present, then the next CAM array block(s) in the sequence is treated as the selected (i.e., current) CAM array block(s), Block 202. As described above with respect to FIG. 4A, the selected CAM array block(s) may not be evaluated until it becomes idle, Block 206. Upon detection of the selected CAM array block(s) as idle, the next group of entries are read from the selected CAM array block(s), Block 208, using a "vertical" read operation (e.g., burst read operation) that spans many rows of a selected CAM array block or a "horizontal" read operation that spans one row (or more rows) in each of a plurality of CAM array blocks. In the illustrated embodiment, the read operation fills the entry buffer 108 with a plurality of entries from the selected CAM array block(s). A background operation is then performed to determine whether any errors are present within the group of entries stored within the entry buffer 108, Block 210B. Here, at least one parity bit per entry may be used to determine the presence of a one-bit error (or possibly more errors) using conventional error detection operations. As described herein, a parity bit represents a type of check bit that facilitates error detection, but not necessarily error correction. A plurality of parity bits may also be evaluated. For example, in some embodiments, one "even" parity bit may apply to the even bits within an entry and another "odd" parity bit may apply to the odd bits within an entry. For example, if the CAM cells comprise, ternary X-Y CAM cells, the even parity bit may apply to the X-bits within an entry and the odd parity bit may apply to the Y-bits within an entry.

If no errors are detected, Block 212, then the next group of entries within the selected CAM array block(s) is pursued, Blocks 204, 206 and 208. However, if one or more errors are detected within the group of entries, then check bits corresponding to one or more of the erroneous entries are read from the check bit memory 110 within the EDC control circuit 104, Block 213. All soft errors in the group of entries are then corrected, Block 214. If necessary, the check bit memory 110 is also updated with any corrected check bits.

An operation is then performed to determine whether the selected CAM array block(s) is again idle, Block 216. Upon detection that the selected CAM array block(s) is idle, the corrected entry (or entries) from the group is then written back into the selected CAM array block(s), Block 218. Returning to Blocks 204 and 202, the next group in the selected CAM array block(s) (or the first group in the next CAM array block(s) within the sequence) is then identified and a read operation is performed. In this manner, the error detection and correction operations are performed continuously during mostly background modes of operation (while foreground search operations and other operations are being performed within the CAM device).

Figure 4C:
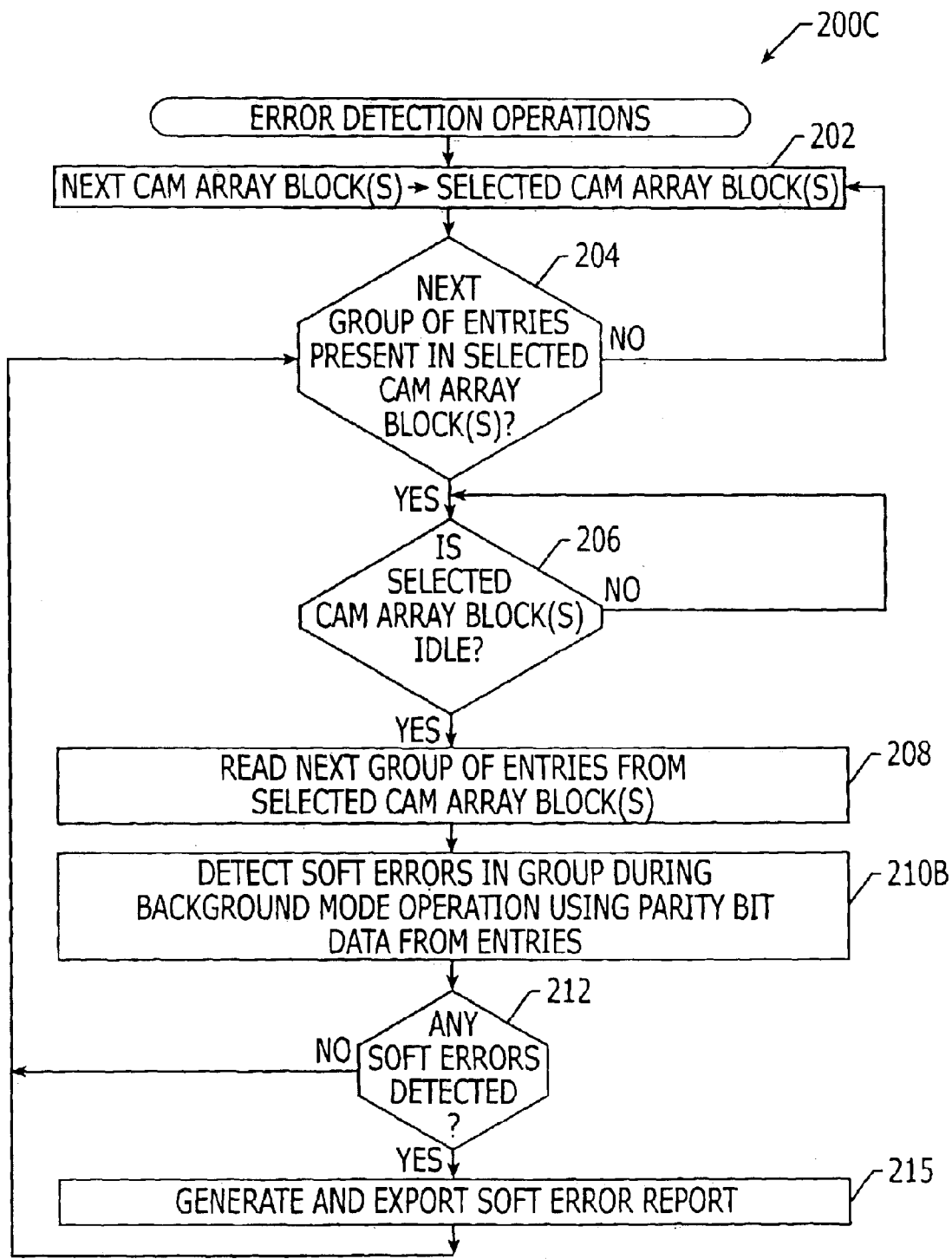
FIG. 4C is a flow diagram of operations that illustrates methods of performing error detection and correction operations in CAM devices, according to embodiments of the present invention.

In some embodiments of the present invention, error detection operations may be performed in the absence of error correction operations. For example, as illustrated by FIG. 4C, the error detection operations 200C include identifying a CAM array block(s) to be evaluated, Block 202. As illustrated by Block 204, a check is made to determine whether a next group of entries to be evaluated is present within the selected CAM array block(s), Block 204. If a next group of entries to be evaluated is not present, then the next CAM array block(s) in the sequence is treated as the selected (i.e., current) CAM array block(s), Block 202. In some cases, the selected CAM array block(s) may not be evaluated until it becomes idle, Block 206. Upon detection of the selected CAM array block(s) as idle, the next group of entries are read from the selected CAM array block(s), Block 208. This read operation may operate to fill the entry buffer 108 with a plurality of entries from the selected group of entries. As illustrated by Block 210B, a background operation is then performed to determine whether any errors are present within the group of entries stored within the entry buffer 108. Here, at least one parity bit, which is a form of check bit, may be used to determine the presence of a one-bit error in an entry, using conventional error detection operations.

If no errors are detected, Block 212, then the next group of entries within the selected CAM array block(s) is pursued, Blocks 204, 206 and 208. However, if one or more errors are detected within the group of entries, then an error report may be generated by an EDC control circuit, Block 215. The operations performed by Block 215 may also include disabling a defective entry within a CAM array block by setting a valid bit cell within a row of the CAM array block that retains the entry to an invalid state. A valid bit cell possessing an invalid state may operate to hold a respective match line at a logic 0 level during search operations. This error report may, in some embodiments, take the form of error report (ER) signals that are generated as outputs from the CAM device. These error report signals may enable an external controller or other device or user to correct the erroneous entries by, for example, rewriting corrected entries into the CAM device. Error report (ER) signals may even be generated in those embodiments where error correction operations are performed internal to the CAM device.

Figure 4D:
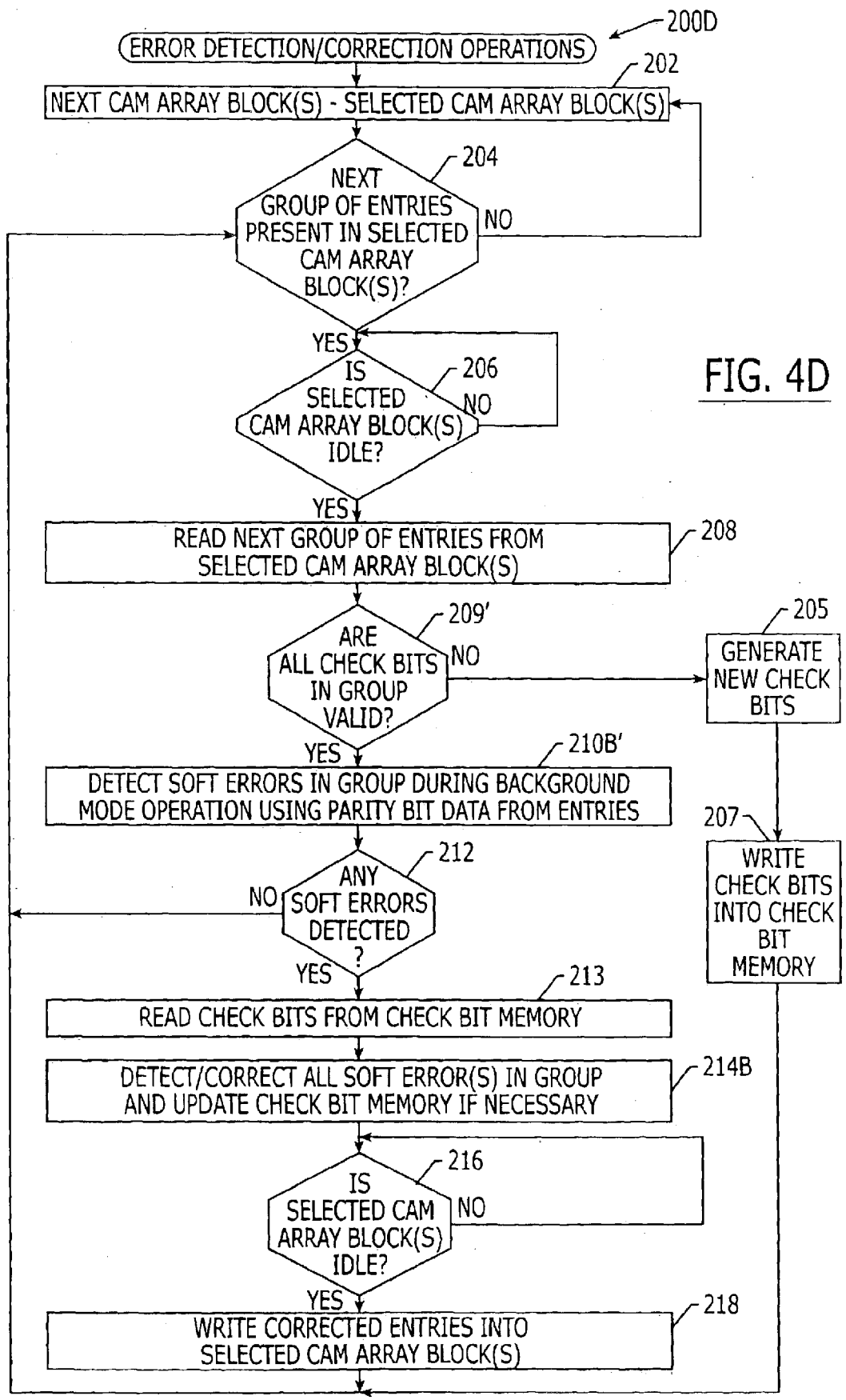
FIG. 4D is a flow diagram of operations that illustrates methods of performing error detection and correction operations in CAM devices, according to embodiments of the present invention.

The error detection and correction operations 200D illustrated by FIG. 4D describe an embodiment whereby at least one flag cell within each row of a CAM array block is used to identify whether the check bit data held by the check bit cells within a respective row is to be treated as valid. For example, in some embodiments, the writing of an entry into a CAM array block may be followed by background operations to generate check bits corresponding to that newly written entry. By generating these check bits after an entry has been written into a CAM array block, the speed at which new entries may be written into a CAM device can be maintained at a high level and shorter write latency may be achieved. Because the check bits associated with a particular CAM entry may be written into a corresponding row some time after the initial write operation has been performed, the possibility that the check bits are not valid at the time a group read operation is performed to check and correct soft errors should be addressed. The operations illustrated by FIG. 4D handle this scenario using operations similar to those of FIG. 4B, by performing a check on the validity of the check bits within a group, Block 209'. If the check bits are not indicated as valid, then new check bit data is generated, Block 205, and the new check bit data is written into the check bit memory, Block 207.

However, if all the check bits are identified as valid, because all the flag cells associated with the current group of entries indicate valid check bit conditions, then control is passed to Block 210B'. At Block 210B', the valid check bit data is used to detect soft errors. As illustrated by Block, 212, if no soft errors are detected, control is passed back to Block 204. In contrast, if one or more soft errors are detected, then control is passed to Block 213. At Block 213, check bits are read from the check bit memory 110 (see, e.g., FIG. 2B). Then, at block 214B, any soft errors within the group are detected and corrected. If necessary, the check bit memory 110 is also updated with any corrected check bits. The corrected entries are then written back into the selected CAM array block(s), Blocks 216 and 218.

The error detection and correction operations 200E in FIG. 4E include the above-described operations illustrated Blocks 202, 204 and 206, as well as a combined operation to (i) read a next group of entries and parity bits from a selected CAM array block(s) and (ii) read check bits (e.g., a check word(s)) and parity bits (which apply to the check word(s)) from a check bit memory, Blocks 208, 213. An operation is then performed to detect parity errors in the group of entries and check bits using parity bit data obtained from the entries and the check bit memory, Block 210B. A check is then made to determine whether any parity errors have been detected, Block 212. If no errors have been detected, then control is returned to Block 204. If an error(s) has been detected, then control is passed to Block 225. At Block 225, a check is made to determine whether an excessive number of errors has been detected. If an excessive number of errors has been detected, then a soft error report is generated and exported, Block 215 (see, e.g., output ER in FIG. 2B). Alternatively, an operation is performed to detect and correct the soft errors, Blocks 210, 214. As illustrated by Blocks 227 and 229, if an error was present in the check bits, then an operation is performed to write the corrected check bits into the check bit memory. Moreover, if an error was present in the entries, then the corrected entry (or entries) is written into the selected CAM array block(s), Blocks 231, 216 and 218, and control is returned to Block 204.

The error detection and correction operations 200F in FIG. 4F are similar to those illustrated by FIG. 4E, however additional operations are performed. These additional operations include an operation to check whether all the check bits are valid, Block 209'. The validity of the check bits may be determined by the valid or invalid state of one or more flag cells associated with the group of entries to be checked. These flag cells may be provided with each entry in a CAM array block or as cells within a flag cell memory witin the CAM device. If the check bits are not valid, then new check bits are computed and written into the check bit memory, Blocks 205 and 207. If the check bits are valid, then the operations illustrated by Block 210B are performed. The subsequent operations are identical to those illustrated by FIG. 4E.

Thus, as illustrated by FIGS. 4A–4F, the CAM devices 100 and 100' undergo various operations to perform error detection and correction of entries within the CAM array blocks. Many of these operations will be performed as background operations that do not interfere with the foreground operations associated with searching the CAM array blocks at high look-up rates. The above-described operations are also facilitated by various CAM and check-bit cell configurations within the rows of the CAM array blocks. These cell configurations will now be described more fully with respect to FIGS. 3A–3F, 5A–5C and 6. Many of these cell configurations may allow for the use of binary CAM cells instead of ternary CAM cells.

According to additional embodiments of the present invention, the check bits may be obtained directly from an external system device when a write operation is requested. This technique eliminates the need for flag cells to determine whether recently written entries have valid check bits. Alternatively, if the check bit data applies to a group of words, then a write operation may include (i) writing a new entry into a CAM array block and (ii) reading all entries in the group associated with the new entry so that new check bit data may be generated that applies to the group of entries. This new check bit data may then be written into one or more of the CAM array blocks during the next write operation or written directly into a dedicated check bit memory. For example, the CAM device may include control circuitry that is configured to respond to a write operation by writing a new word into a row(s) of a CAM array block and also reading a plurality of words that are associated with the row(s) from one or more of the plurality of CAM array blocks. A check bit word may then be generated that supports correction of at least one error in a "combined" word that comprises the new word and the plurality of words. This check bit word is then stored in the CAM device (e.g., one or more CAM array blocks or a check bit memory array).

Address compare circuitry may also be provided to confirm or deny whether the check bits associate with an entry or group of entries are valid. For example, if a compare operation performed by the address compare circuitry detects an attempt to write an entry to a group that was recently written to, then the check bits that are associated with that group of entries may be treated as invalid and replaced prior to further error correction operations. Moreover, if entries with CAM array blocks include parity data to enable the detection of one or more errors within an entry or entries, then operations may also need to be performed to correct the corresponding check bits within any dedicated check bit memory.

The advantages of performing background EDC operations within CAM devices can also be achieved in other types of memory devices (e.g., SRAM). For example, as the soft error rate increases within RAM devices that do not have data-refresh capability (i.e., "non-refresh" RAM), the likelihood that conventional EDC circuits within a read path of the RAM device will be capable of correcting all read data errors will decrease. This is particularly true if the EDC-circuits in the read path perform only single bit error correction, which is typically the case. To address this deficiency within "non-refresh" RAM devices and to reduce the probability of a read error caused by a two-bit soft error in an entry being read from the RAM device, the above-described background EDC operations may be performed. To increase the speed at which these background EDC operations may be performed, parity bits may be used to provide fast error detection (in the entries and check words). Then, only if an error is detected will the generally slower operations to detect the location of an error and correct the error be performed. These background operations will have the effect or regularly purging the RAM of at least most soft errors and significantly reduce the likelihood that an uncorrectable read error will be present during a operation to read an entry.

FIG. 3A is a block diagram that illustrates an arrangement of cells within a row 120A of a ternary CAM array block. The row 120A illustrates 80 ternary CAM cells, TCAM Cell 0–TCAM Cell 79, and eight check bit cells C0–C7 that are arranged in pairs. These CAM cells are illustrated as lateral XY CAM cells, which are more fully illustrated and described in the aforementioned '400 application. For ease of understanding, the locations of redundant CAM cells and redundant check bit cells are not illustrated by FIG. 3A. According to a preferred aspect of this row 120A, the lateral footprint of each check bit cell pair is the same as lateral footprint of the CAM cells. These equivalent footprints facilitate uniform spacing of vertical signal lines that span the CAM array block. Although not shown, the 80 ternary CAM cells may be grouped into segments and sub-segments, as described more fully in the aforementioned '236 application. The eight check bit cells are sufficient to enable error detection and one-bit error correction operations. In particular, the eight check bit cells support a check word having a length "c" where c=8 and $2^c \geq 2N+c+1 \geq 2^{c-1}$, with N=80, the logical width of the CAM array block. In the event the CAM cells are binary CAM cells, the check word may have a length c=7 where $2^7 \geq 80+7+1 \geq 2^6$.

The row 120B is similar to row 120A, however, the CAM cells are illustrated as comprising quaternary CAM cells, comprising both data and mask information. In particular, the row 120B may include 80 data bits (X0–X79) and 80 mask bits (M0–M79). Thus, $2N=N_d+N_m$, where $N_d$ equals the number of data bits and $N_m$ equals the number of mask bits. For purposes of discussion herein, ternary and quaternary CAM cells will be treated as different variants of a ternary CAM cell configuration because both cells possess one of only three (3) valid states during a search operation (1, 0 or actively masked).

The row 120C of CAM and check bit cells illustrated by FIG. 3C is similar to the row 120B, however, the cells within each pair are arranged vertically relative to each other and, therefore, provide a different aspect ratio to the CAM array block. Based on this vertical arrangement, the even check bit cells C0, C2, C4 and C6 and data cells D0–D79 may be associated with one word line and the odd check bit cells C1, C3, C5 and C7 and mask cells M0–M79 may be associated with another word line.

Figure 3D:
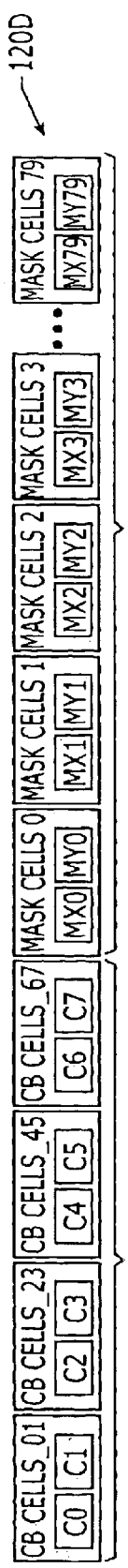
FIG. 3D is a block diagram that illustrates an arrangement of global mask cells and check bit cells within a row of a global mask cell sub-array, according to embodiments of the present invention.
Figure 5A:
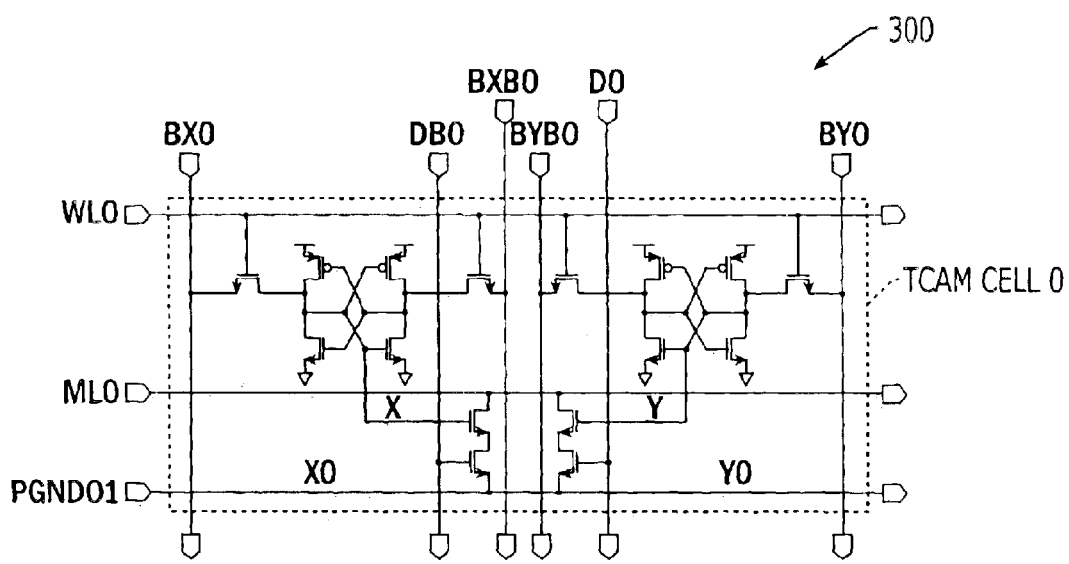
FIG. 5A is an electrical schematic of a ternary CAM cell that may be used in the rows illustrated by FIGS. 3A and 3E–3F.
Figure 5B:
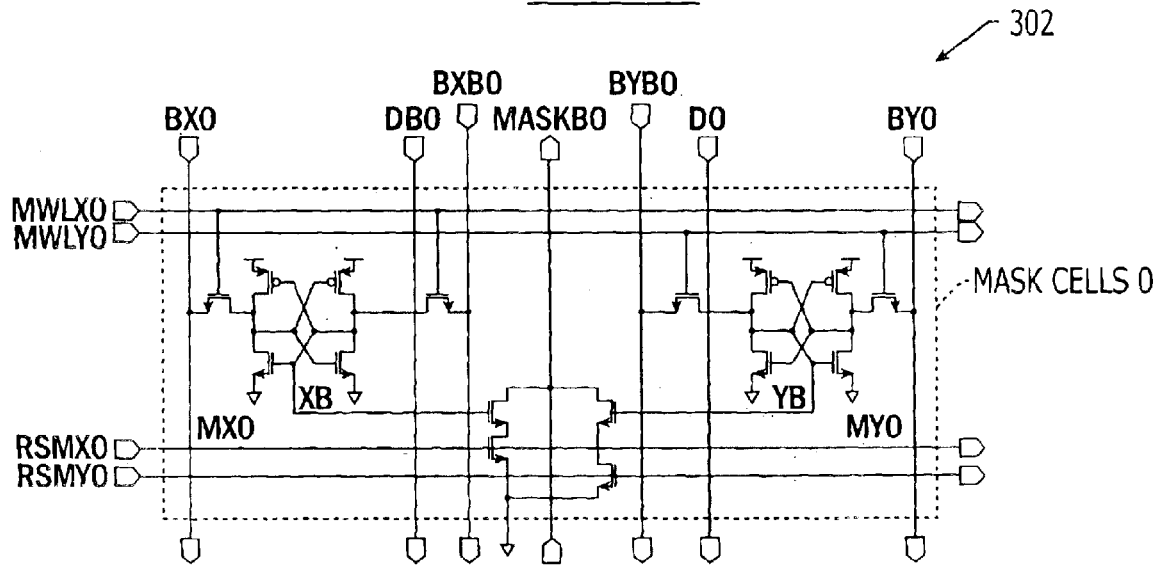
FIG. 5B is an electrical schematic of a pair of global mask cells that may be used in the row illustrated by FIG. 3D.

The row 120D of global mask cells and check bit cells illustrated by FIG. 3D may be used within a mask cell sub-array within each CAM array block. In particular, the row 120D includes two 80-bit global masks that may be individually asserted during a search operation. FIG. 5B is an electrical schematic of a pair of mask cells 302 illustrated by FIG. 3D. This pair of mask cells 302 retains one bit of an 80-bit global mask X and one bit of an 80-bit global mask Y. The vertical signal lines BX0, BXB0, BYB0 and BY0 represent two pairs of differential bit lines that are electrically coupled to the left side SRAM cell (X0) and the right side SRAM cell (Y0), respectively. The differential pair of data lines (shown as D0 and DB0) are not connected to the mask cells. Instead, the data lines pass over the rows of global mask cells. This pass over of the data lines is typically necessary when the mask cell sub-array is disposed between the CAM cell sub-array and a bit/data line control circuit (not shown).

Each mask cell within a pair is connected to a respective word line (shown as MWLX0 and MWLY0). The mask cells may be read in preparation for a search operation by switching one of the read mask signal lines (shown as RSMX0 and RSMY0) to an active high level. A vertical global mask signal line (shown as MASKB0) operates to pass global mask information from the mask cells to the bit/data line control circuit. The operation of these global mask cells within a CAM array block is more fully described in the aforementioned '400 application. In some embodiments, the SRAM cells within these mask cells may be configured to be less susceptible to soft errors relative to the CAM cells. The eight (8) check bit cells C0–C7 illustrated by FIG. 3D facilitate the detection and correction of a one-bit soft error in the composite string of 160 global mask bits, which represent two x80 global masks. If the global masks were treated individually, then 14 check bit cells would be required to detect and correct one-error in each global mask within a row of a mask cell sub-array.

Figure 3E:
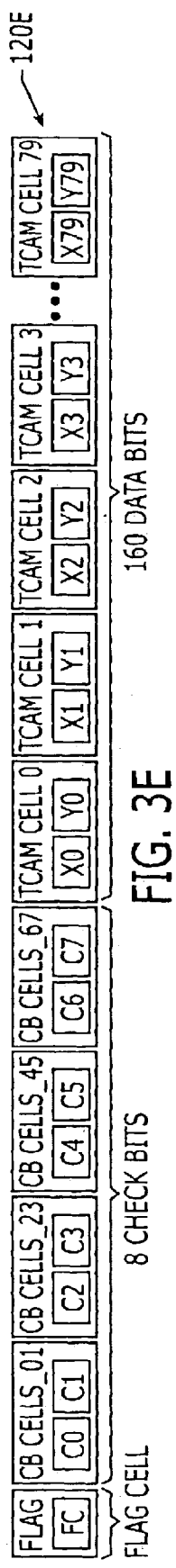
FIG. 3E is a block diagram that illustrates another arrangement of cells within a row of a ternary CAM array block, according to embodiments of the present invention.

Referring now to FIG. 3E, a row 120E containing a plurality of CAM cells, a plurality of check bit cells and a flag cell is illustrated. This row 120E is similar to the row 120A illustrated by FIG. 3A, however an additional flag cell FC is illustrated. This flag cell FC may be used to indicate whether the check bit information contained in the check bit cells is to be treated as valid or invalid when a group of entries are read from a respective CAM array block and error detection and correction operations are performed (see, e.g., FIG. 4D). This flag cell may be particularly useful in situations where the check bit information is internally generated and then written into a CAM array following the original writing of the data bits (and mask bits, if any) into the CAM cells. Although the flag cell (FC) is illustrated as being a cell within a CAM row, the flag cells may actually be located external to a respective CAM array block.

Figure 3F:
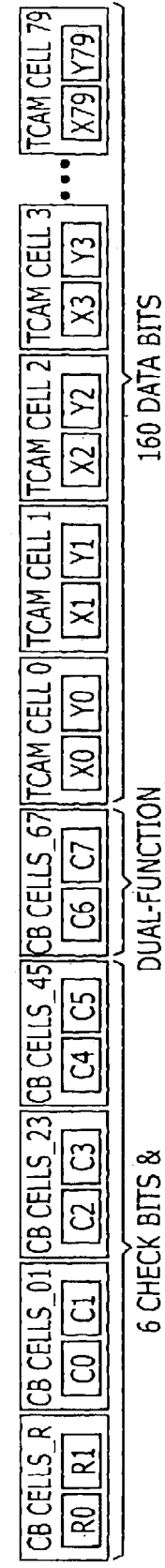
FIG. 3F is a block diagram that illustrates an arrangement of cells within a row of a ternary CAM array block, according to embodiments of the present invention.

In FIG. 3F, a row 120F containing a plurality of TCAM cells, a plurality of dedicated check bit cells, a dual-function check bit cell pair and a redundant pair of check bit cells, is illustrated. This row 120F is similar to row 120A in FIG. 3A, however, one pair of check bit cells has been replaced by a dual-function check bit cell pair (C6, C7) and an additional pair of redundant check bit cells (R0, R1) has been added. The cells in this row 120F are further illustrated by the detailed electrical schematics of FIGS. 5A, 5C and 6. In FIG. 5A, a ternary CAM cell 300 is illustrated. This CAM cell 300 includes two static random access memory (SRAM) cells that are electrically coupled to respective pairs of differential bit lines (shown as (BX0, BXB0) and (BY0, BYB0)). A CAM cell comprising SRAM cells therein may be referred to herein as a static content addressable memory (SCAM) cell. The compare logic with the CAM cell 300 comprises four transistors which are configured to perform an XOR function. The compare logic is connected between a match line (shown as ML0) and a pseudo-ground line (shown as a pseudo-ground line PGND01 that is shared by rows 0 and 1 of a CAM cell sub-array). This pseudo-ground line may be replaced by a ground reference line (GND) in some embodiments.

Figure 5C:
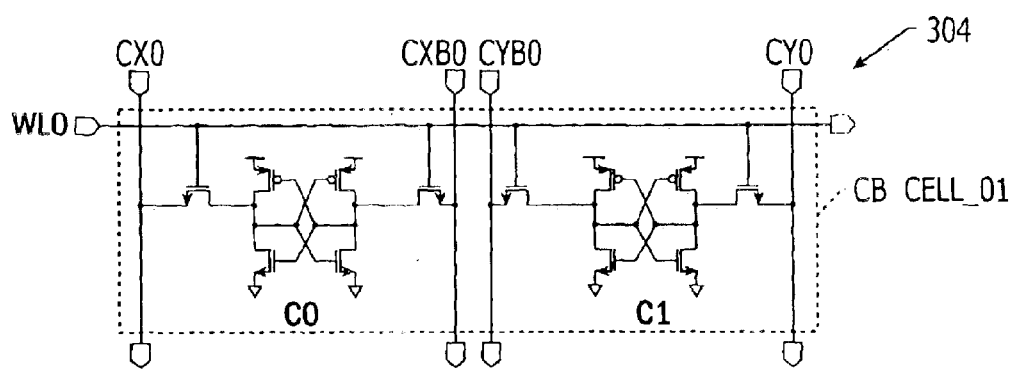
FIG. 5C is an electrical schematic of a pair of dedicated-check bit cells that may be used in the rows illustrated by FIGS. 3A–3B and 3D–3E.

During a search operation, the compare logic receives a pair of differential data signals on signal lines D0 and DB0. In the event the CAM cell 300 is to be globally masked during a search operation, the signal lines D0 and DB0 are both set to a logic 0 level. The access transistors within each SRAM cell X0 and Y0 are electrically connected to a common word line (shown as WL0). The operation and construction of the CAM cell 300 is more fully described in the aforementioned '400 application and in U.S. application Ser. Nos. 10/084,842, to Lien et al., filed Feb. 27, 2002, and Ser. No. 10/306,799, to Lien et al., filed Nov. 27, 2002, the disclosures of which are hereby incorporated herein by reference. FIG. 5C illustrates a pair of dedicated check bit cells 304, shown as CB CELL_01. These check bit cells are illustrated as SRAM cells C0 and C1 that share a common word line, shown as WL0. The SRAM cell C0 is connected to a pair of differential bit lines, shown as CX0 and CXB0, and the SRAM cell C1 is connected to a pair of differential bit lines, shown as CY0 and CYB0. As illustrated more fully by FIG. 6, the SRAM cells within these dedicated check bit cells are preferably configured to be less susceptible to soft errors relative to the SRAM cells within the CAM cells: This may be achieved by making the SRAM latching inverters in the check bit cells larger than the SRAM latching inverters in the CAM cells. This may be done by increasing the size (e.g., width) of the NMOS pull-down transistors within each latching inverter.

Figure 6:
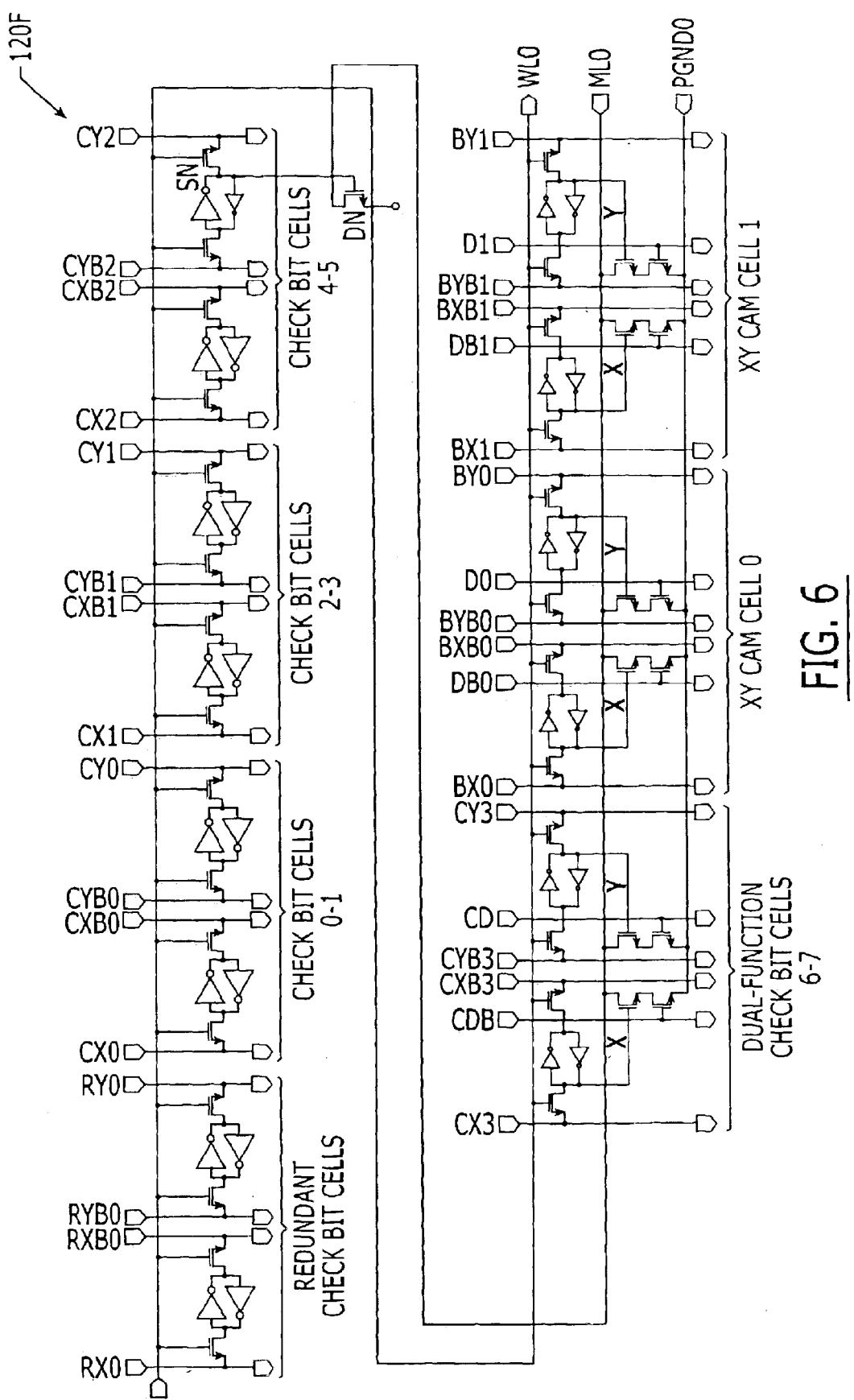
FIG. 6 is an electrical schematic of a row of cells from a CAM array block, according to an embodiment of the present invention. The row includes ternary CAM cells; a dual-function check bit cell pair, a plurality of dedicated check bit cells and a redundant check bit cell pair.

In the row 120F illustrated by FIG. 6, a pair of redundant check bit cells are illustrated along with a pair of dual function check bit cells, shown as check bit cells 6–7. The vertical signal lines that are illustrated represent differential pairs of bit lines (shown with letters X and Y notation) and differential pairs of data lines (shown with the letter D). The redundant check bit cells are connected to pairs of redundant bit lines (RX0, RXB0) and (RY0, RYB0). These redundant bit lines are enabled whenever the redundant check bit cells are required to perform a column redundancy function. For example, if any of the columns associated with the illustrated pairs of check bit cells or CAM cells is detected as being defective during reliability testing, then a column of redundant check bit cell pairs will become active.

The pair of check bit cells that extend between the rightmost pair of dedicated check bit cells (shown as check bit cells 4–5) and the leftmost pair of TCAM cells (shown as XY CAM CELL 0) are configured to perform one of two different functions. In the event none of the columns of CAM cells in a leftmost segment of the CAM array block (e.g., first of four×20 segments) are defective, then the dual-function check bit cells 6–7 operate as check bit cells. This can be achieved by permanently applying a global mask to the differential data lines CD and CDB (i.e., CD=CDB=0) after reliability testing is complete. Setting data lines CD and CDB to logic 0 levels operates to disable the XOR logic within the check bit cells 6–7. This XOR logic, which comprises four NMOS transistors, is illustrated as being connected to the illustrated match line (ML0) and the illustrated pseudo-ground line (PGND0). Alternatively, if one of the columns of CAM cells in the leftmost segment is defective, then the pair of check bit cells 6–7 can be enabled to operate as a TCAM cell and the data lines CD and CDB are enabled by a bit-data line control circuit (not shown). For example, if the illustrated XY CAM CELL 1 is defective, then the pair of check bit cells 6–7 will be enabled to operate as a ternary CAM cell within a first column of TCAM cells and the redundant check bit cells R0 and R1 will be enabled to operate as a pair of dedicated check bit cells.

Based on symmetrical layout considerations that may require close proximity between check bit cell 5 and check bit cell 6, the check bit cell 5 may include a pair of latching inverters having different sizes. For example, the check bit cell 5 may include one SRAM storage node (shown as SN) that is electrically connected to an input of a relatively small inverter, an output of a larger inverter and a gate terminal of a dummy NMOS transistor DN, which has a drain terminal electrically coupled to a match line (shown as ML0). To improve soft error immunity, the capacitance of this storage node SN may be balanced with the capacitance of the opposite SRAM storage node that is connected to an output of the relatively small inverter.

In order to reduce the number of check bit cells associated with each entry, it may be advantageous to perform error detection and correction on a sub-block of entries. For example, if a ternary CAM array block supports 80-bit entries, two (2) check bit cells may be provided within a sub-block of five rows within a CAM array block(s). This is because only 10 check bits are necessary in a check word to provide one-bit error detection and correction in a composite word having a width equal to 800 (5×80×2) bits. Thus, according to another embodiment of the present invention, a CAM array block may be provided having a plurality of rows of CAM cells therein, with each of the plurality of rows comprising $c(m^{-1})$ active check bit cells therein that are grouped vertically, where m is the number of rows in the sub-block, c is a length of a check word, N' equals the total number of data bits (or data and mask bits) of information within an entry and $2^c \geq mN'+c+1 \geq 2^{c-1}$ (e.g., $2^{10} \geq 5(80 \times 2)+10+1 \geq 2^9$).

Similarly, a pair of check bit cells in each row of five adjacent CAM array blocks may be grouped horizontally to thereby provide 10 bits of check bit data. A flag bit cell may also be required in one of the five CAM array blocks within a group, to indicate whether the 10 bits of check bit data are to be treated as valid or invalid. As will be understood by those skilled in the art, the 10 bits of check bit data cannot be generated until the five corresponding entries in the five CAM array blocks within a horizontal group have been written. Moreover, any time one or more of the five entries within a group is updated during a write operation, the 10 bits of check bit data will need to be updated as well. If this update of the check bit data is not simultaneous with the writing of the new entry within the group, then the flag bit cell will need to be reset to indicate that the check bit data is not valid. Accordingly, in the event background error detection and correction operations are attempted on a group of entries having invalid check bits (as designated by the state of the corresponding flag cell, which is read during the background operations), these operations will be terminated upon evaluation of the state of the flag bit. Instead, the data within the five entries will be used to generate new check bits, which will then be written back into respective locations within the five entries (along with updating the flag bit cell to indicate the validity of the new check bits).

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A content addressable memory (CAM) device, comprising:
   a CAM array block having at least one row therein that comprises a plurality of CAM cells and a dual-function check bit cell pair that is configurable as a CAM cell when necessary to account for a defective CAM cell in the at least one row.

2. The CAM device of claim 1, wherein the at least one row comprises a plurality of dedicated check bit cells that are not configurable as CAM cells.

3. The CAM device of claim 2, wherein at least some of the dedicated check bit cells are configured to retain parity data.

4. The CAM device of claim 2, wherein a first dedicated check bit cell in the plurality thereof is configured to be less susceptible to soft errors relative to a check bit cell in the dual-function check bit cell pair by virtue of the fact that latching inverters within the first dedicated check bit cell are larger than latching inverters within the check bit cell in the dual-function check bit cell pair.

5. The CAM device of claim 2, wherein the at least one row comprises at least one redundant check bit cell.

6. The CAM device of claim 1, wherein each of the plurality of CAM cells comprises at least one SRAM memory cell having a first pair of inverters therein that define a first latch; wherein the at least one row comprises a dedicated SRAM check bit cell having a second pair of inverters therein that define a second latch; and wherein the second pair of inverters are larger than the first pair of inverters.

7. The CAM device of claim 1, wherein the at least one row further comprises at least one dedicated check bit cell and at least one flag cell therein, said at least one flag cell configured to designate a valid of invalid status of a respective check bit(s) retained by the at least one dedicated check bit cell.

8. The CAM device of claim 1, wherein the dual-function check bit cell pair comprises a 4T compare circuit.

9. The CAM device of claim 1, wherein the CAM cells are static CAM cells.

10. The CAM device of claim 1, wherein the plurality of CAM cells and the dual-function check bit cell pair are electrically connected to a match line associated with the at least one row.

11. The CAM device of claim 10, wherein the at least one row comprises at least one dedicated check bit cell that is not electrically connected to the match line.

12. The CAM device of claim 2, wherein a first dedicated check bit cell in the plurality thereof is configured to be less susceptible to soft errors relative to a check bit cell in the dual-function check bit cell.

13. A content addressable memory (CAM) device, comprising:
   a CAM array block having a row therein comprising a plurality of CAM cells, a plurality of dedicated check bit cells and a dual-function check bit cell pair that is configurable as a CAM cell when necessary to account for a defective CAM cell in the row.

14. The CAM device of claim 13, wherein the row further comprises a redundant check bit cell therein.

* * * * *

UNITED STATES PATENT AND TRADEMARK OFFICE
CERTIFICATE OF CORRECTION

PATENT NO. : 6,870,749 B1
DATED : March 22, 2005
INVENTOR(S) : Park et al.

It is certified that error appears in the above-identified patent and that said Letters Patent is hereby corrected as shown below:

Title page,
Item [56], References Cited, U.S. PATENT DOCUMENTS, should include
-- 6,564,754   5/2003   Lien et al.
   6,137,707   10/2000   Srinivasan et al. --

Signed and Sealed this

Fourteenth Day of June, 2005

JON W. DUDAS
*Director of the United States Patent and Trademark Office*